(12) United States Patent　　　　(10) Patent No.:　US 12,647,089 B2

Kikuda　　　　　　　　　　　　　　(45) Date of Patent:　Jun. 2, 2026

---

(54) FILTER DEVICE AND RADIO FREQUENCY FRONT END CIRCUIT

(71) Applicant: Murata Manufacturing Co., Ltd., Nagaokakyo (JP)

(72) Inventor: Masayuki Kikuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 229 days.

(21) Appl. No.: 18/530,295

(22) Filed: Dec. 6, 2023

(65) Prior Publication Data

US 2024/0136995 A1　　Apr. 25, 2024
US 2024/0235515 A9　　Jul. 11, 2024

Related U.S. Application Data

(63) Continuation of application No. PCT/JP2022/022348, filed on Jun. 1, 2022.

(30) Foreign Application Priority Data

Jul. 6, 2021　　(JP) ................................. 2021-112053

(51) Int. Cl.
H03H 7/01　　　　(2006.01)
H01P 1/20　　　　(2006.01)

(52) U.S. Cl.
CPC ............. H03H 7/0115 (2013.01); H01P 1/20 (2013.01)

(58) Field of Classification Search
CPC ................................ H03H 7/0115; H01P 1/20
USPC ................................................. 333/165, 219
See application file for complete search history.

(56) References Cited

U.S. PATENT DOCUMENTS

| | | | |
|---|---|---|---|
| 2007/0120627 A1* | 5/2007 | Kundu | ................ H01P 1/20345 |
| | | | 333/204 |
| 2009/0236141 A1* | 9/2009 | Kim | ..................... H05K 1/0236 |
| | | | 174/360 |
| 2010/0134212 A1 | 6/2010 | Kim et al. | |
| 2011/0012697 A1 | 1/2011 | Takemura et al. | |

(Continued)

FOREIGN PATENT DOCUMENTS

| | | |
|---|---|---|
| JP | 2009-231793 A | 10/2009 |
| WO | 2005/104149 A1 | 11/2005 |

(Continued)

OTHER PUBLICATIONS

Official Communication issued in International Patent Application No. PCT/JP2022/022348, mailed on Aug. 23, 2022.

*Primary Examiner* — Andrea Lindgren Baltzell
*Assistant Examiner* — Victor Cole

(57) ABSTRACT

A filter device includes input and output terminals, first and second ground electrodes opposed to each other, and a resonator connected to one of the input and output terminals. The resonator includes a third ground electrode, and first, second, and third resonant portions. The third ground electrode is between and connected to the first and second ground electrodes. The first resonant portion is between the first and third ground electrodes, and connected to the third ground electrode and one of the input and output terminals. The second resonant portion is between the first and third ground electrodes, and connected to the third ground electrode. The third resonant portion is between the second and third ground electrodes, and connected to the third ground electrode.

18 Claims, 25 Drawing Sheets

(56) References Cited

U.S. PATENT DOCUMENTS

| | | | |
|---|---|---|---|
| 2013/0057362 A1 | 3/2013 | Wu et al. | |
| 2022/0037754 A1* | 2/2022 | Jian ........................... | H01P 1/20 |

FOREIGN PATENT DOCUMENTS

| | | | |
|---|---|---|---|
| WO | 2009/060696 A1 | 5/2009 |
| WO | 2009/131140 A1 | 10/2009 |

* cited by examiner

FIG.1

| RESONATOR RT10 | RESONANT UNIT RT11 : P11+V11+G3 |
| | RESONANT UNIT RT12 : P12+V12+G3 |
| | RESONANT UNIT RT13 : G3+V13+P13 |
| RESONATOR RT30 : P311+V31+P312 |
| RESONATOR RT40 : P411+V41+P412 |
| RESONATOR RT50 : P511+V511+V512+V513+P512 |
| RESONATOR RT60 : P611+V61+P612 |
| RESONATOR RT70 : P711+V71+P712 |
| RESONATOR RT20(RT21,RT22,RT23): |
| REFERENCE CHARACTER OMITTED |

RESONATOR RT10
RESONANT UNIT RT11 : P11+V11+G3
RESONANT UNIT RT12 : P12+V12+G3
RESONANT UNIT RT13 : G3+V13+P13
RESONATOR RT30 : P311+V31+P312
RESONATOR RT40 : P411+V41+P412
RESONATOR RT50 : P511+V511+V512+V513+P512
RESONATOR RT60 : P611+V61+P612
RESONATOR RT70 : P711+V71+P712
RESONATOR RT20
RESONANT UNIT RT21 : P21+V21+G3
RESONANT UNIT RT22 : P22+V22+G3
RESONANT UNIT RT23 : G3+V23+P23

| RESONATOR RT10 | RESONANT UNIT RT11 : P11+V11+G3 |
| | RESONANT UNIT RT12 : P12+V12+G3 |
| | RESONANT UNIT RT13 : G3+V13+P13 |

FILTER DEVICE AND RADIO FREQUENCY FRONT END CIRCUIT

CROSS REFERENCE TO RELATED APPLICATIONS

This application claims the benefit of priority to Japanese Patent Application No. 2021-112053 filed on Jul. 6, 2021 and is a Continuation Application of PCT Application No. PCT/JP2022/022348 filed on Jun. 1, 2022. The entire contents of each application are hereby incorporated herein by reference.

BACKGROUND OF THE INVENTION

1. Field of the Invention

The present disclosure relates to a filter device and a radio frequency front end circuit, and more particularly to a technique to improve a characteristic of a filter device including a resonator.

2. Description of the Related Art

WO 2009/060696 discloses a chip type filter component having a ground electrode disposed so as to surround a resonator electrode, and including input/output electrodes coupled to the resonator electrode. In the chip type filter component disclosed in WO 2009/060696, an electrode length of an electrode unit provided inside the chip's body is set to a length of ½ of a wavelength corresponding to a frequency lower than the resonator electrode's resonance frequency.

Configuring the chip type filter component as described above can reduce unnecessary spurious emissions caused by a waveguide mode occurring in a vicinity of a passband.

In recent years, frequency bands used for radio communications increase as communication standards increase, and adjacent frequency bands may be used at very narrow intervals. Accordingly, such a filter device as disclosed in WO 2009/060696 is generally required to be capable of appropriately adjusting a passband for a signal, and pass a signal with low loss in a desired passband and efficiently attenuate a signal in a non-passband other than the desired passband.

SUMMARY OF THE INVENTION

Preferred embodiments of the present invention provide filter devices each including a resonator and being able to appropriately adjust a passband for a signal and improve an attenuation characteristic in a non-passband.

A filter device according to a preferred embodiment of the present invention includes an input terminal, an output terminal, a first ground electrode and a second ground electrode opposed to each other, and a first resonator connected to either one of the input terminal and the output terminal. The first resonator includes a first intermediate ground electrode, a first resonant portion, a second resonant portion, and a third resonant portion. The first intermediate ground electrode is provided between the first ground electrode and the second ground electrode, and is connected to the first ground electrode and the second ground electrode. The first resonant portion is provided between the first ground electrode and the first intermediate ground electrode, and is connected to the first intermediate ground electrode and the one of the input terminal and the output terminal.

The second resonant portion is provided between the first ground electrode and the first intermediate ground electrode, and is connected to the first intermediate ground electrode. The third resonant portion is provided between the second ground electrode and the first intermediate ground electrode, and is connected to the first intermediate ground electrode.

A filter device according to a preferred embodiment of the present invention includes an input terminal, an output terminal, a first ground electrode and a second ground electrode opposed to each other, a first resonator connected to the input terminal, a second resonator connected to the output terminal, and at least one intermediate resonator coupled to at least one of the first resonator and the second resonator by inductive coupling. The first resonator includes a first intermediate ground electrode, a first resonant portion, a second resonant portion, and a third resonant portion. The first intermediate ground electrode is provided between the first ground electrode and the second ground electrode, and is connected to the first ground electrode and the second ground electrode. The first resonant portion is provided between the first ground electrode and the first intermediate ground electrode, and is connected to the first intermediate ground electrode and the input terminal. The second resonant portion is provided between the first ground electrode and the first intermediate ground electrode, and is connected to the first intermediate ground electrode. The third resonant portion is provided between the second ground electrode and the first intermediate ground electrode, and is connected to the first intermediate ground electrode. The second resonator includes a second intermediate ground electrode, a fourth resonant portion, a fifth resonant portion, and a sixth resonant portion. The second intermediate ground electrode is provided between the first ground electrode and the second ground electrode, and is connected to the first ground electrode and the second ground electrode. The fourth resonant portion is provided between the first ground electrode and the second intermediate ground electrode, and is connected to the second intermediate ground electrode and the output terminal. The fifth resonant portion is provided between the first ground electrode and the second intermediate ground electrode, and is connected to the second intermediate ground electrode. The sixth resonant portion is provided between the second ground electrode and the second intermediate ground electrode, and is connected to the second intermediate ground electrode.

According to preferred embodiments of the present invention, by positionally adjusting a third resonant portion provided between a second ground electrode and a first intermediate ground electrode, an attenuation pole is able to be generated in a transmission characteristic of filter devices by resonance in a first resonant portion, a second resonant portion, and the third resonant portion. This enables a passband for a signal to be appropriately adjusted, and improves an attenuation characteristic in a non-passband.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a block diagram of a communication device including a radio frequency front end circuit to which a filter device according to a first preferred embodiment of the present invention is applied.

FIG. 11 is a diagram representing a transmission characteristic of the resonator of FIG. 10.

FIG. 15 represents a transmission characteristic of a filter device according to a comparative example.

FIG. 21 is a diagram schematically showing a positional relationship of each resonant portion in the resonator according to the exemplary variation.

FIG. 22 is a diagram representing a transmission characteristic of the resonator of FIG. 21.

DETAILED DESCRIPTION OF THE PREFERRED EMBODIMENTS

Figure 2:
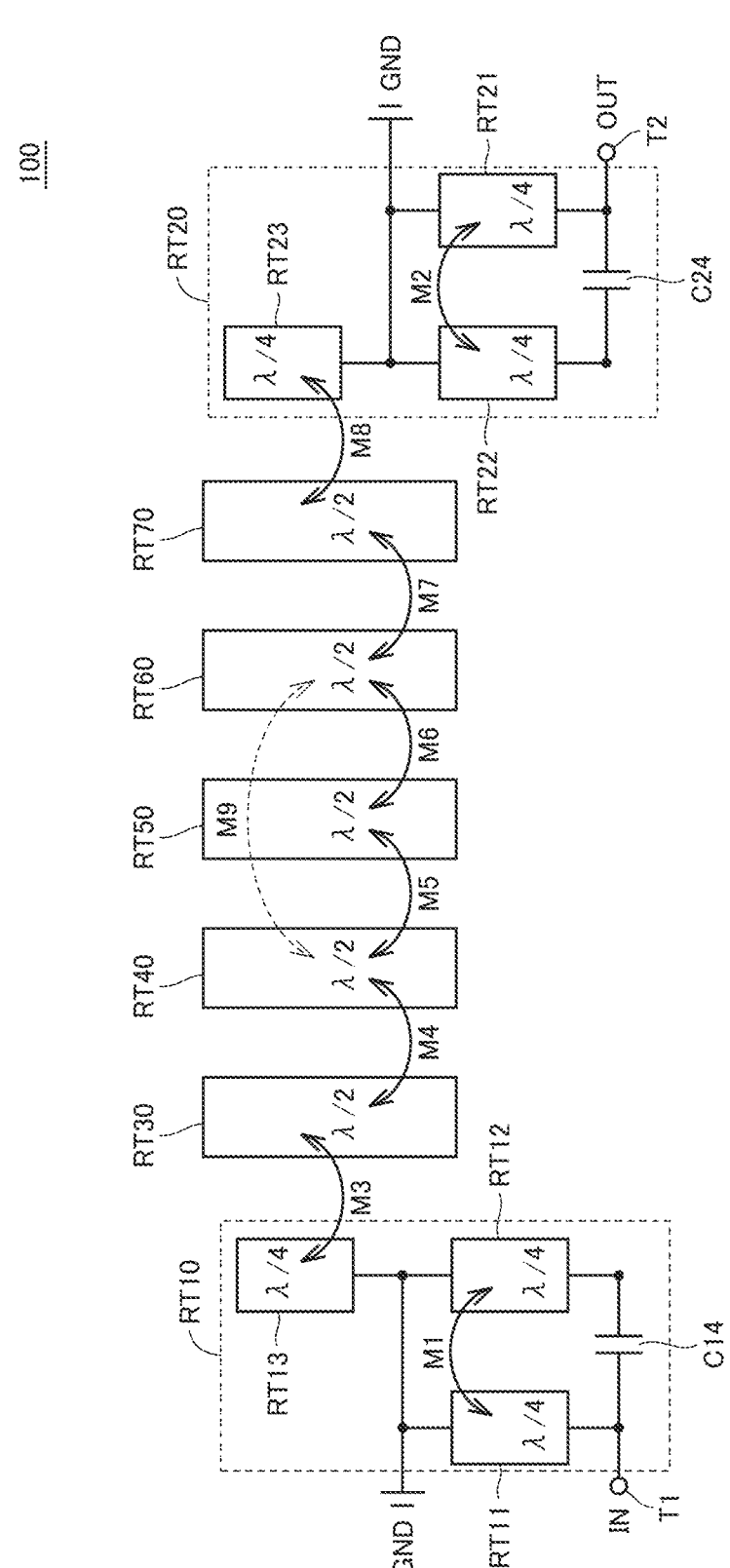
FIG. 2 is a diagram showing a coupling relationship in the filter device according to the first preferred embodiment of the present invention.

Hereinafter, preferred embodiments of the present disclosure will be described in detail with reference to the accompanying drawings. In the drawings, the same or corresponding components are denoted by the same reference characters and will not be described repeatedly.

First Preferred Embodiment

Basic Configuration of Communication Device 10

Figure 1:
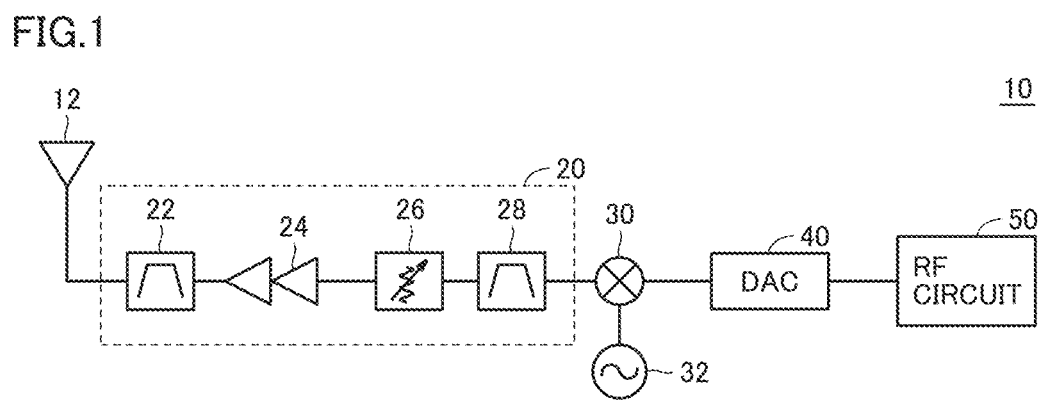

FIG. 1 is a block diagram of a communication device 10 including a radio frequency front end circuit 20 to which a filter device according to a first preferred embodiment of the present invention is applied. Communication device 10 is, for example, a mobile phone base station.

Referring to FIG. 1, communication device 10 includes an antenna 12, a radio frequency front end circuit 20, a mixer 30, a local oscillator 32, a D/A converter (DAC) 40, and an RF circuit 50. Radio frequency front end circuit 20 includes band-pass filters 22 and 28, an amplifier 24, and an attenuator 26. Although FIG. 1 illustrates an example where radio frequency front end circuit 20 includes a transmission circuit to transmit a radio frequency signal from antenna 12, radio frequency front end circuit 20 may include a reception circuit to transmit a radio frequency signal received by antenna 12, for example.

Communication device 10 receives a signal transmitted from RF circuit 50, up-converts the signal to a radio frequency signal, and emits the radio frequency signal from antenna 12. A modulated digital signal, which is a transmission signal output from RF circuit 50, is converted into an analog signal by D/A converter 40. Mixer 30 mixes the transmission signal converted from a digital signal to an analog signal by D/A converter 40 with an oscillation signal received from local oscillator 32 and up-converts the mixture of the signals to a radio frequency signal. Band-pass filter 28 removes unnecessary waves generated by the up-conversion and extracts only a transmission signal in a desired frequency band. Attenuator 26 adjusts the transmission signal in intensity. Amplifier 24 amplifies the transmission signal having passed through attenuator 26 to a predetermined level of power. Band-pass filter 22 removes unwanted waves generated in the amplification process and transmits only a signal component in a frequency band determined by communication standards. The transmission signal having passed through band-pass filter 22 is emitted through antenna 12.

A filter device 100 according to a preferred embodiment of the present invention can be used as bandpass filters 22 and 28 in communication device 10 as described above.

Circuit Configuration of Filter Device 100

Figure 3:
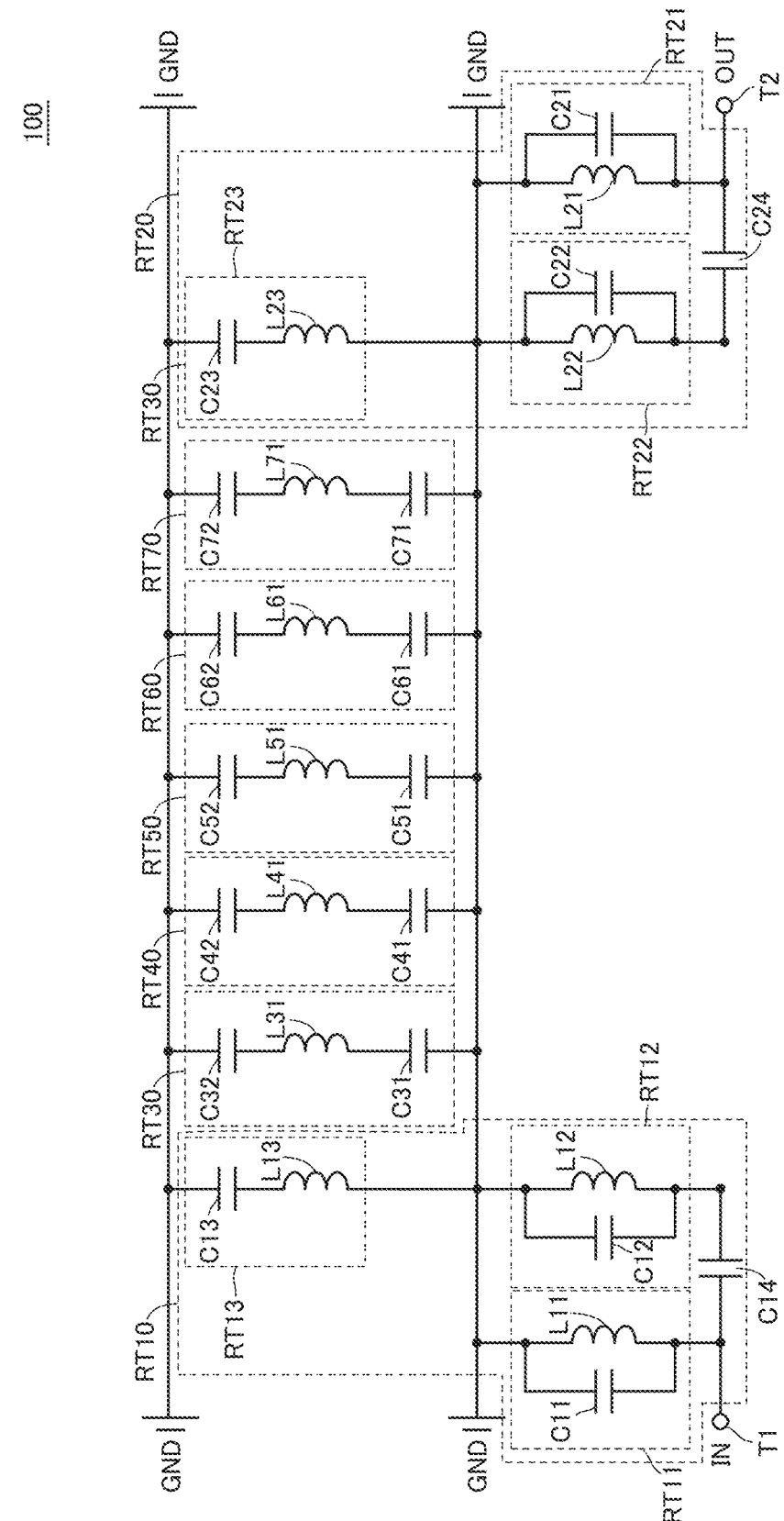
FIG. 3 is an equivalent circuit diagram of the filter device according to the first preferred embodiment of the present invention.

A circuit configuration of filter device 100 according to the first preferred embodiment will now be described with reference to FIGS. 2 and 3. FIG. 2 is a diagram showing a coupling relationship in filter device 100 according to the first preferred embodiment. FIG. 3 is an equivalent circuit diagram of filter device 100 according to the first preferred embodiment.

Referring to FIGS. 2 and 3, filter device 100 includes an input terminal T1, an output terminal T2, and a plurality of resonators RT10 to RT70 provided between input terminal T1 and output terminal T2. Specifically, filter device 100 includes a resonator RT10 connected to input terminal T1, a resonator RT20 connected to output terminal T2, and a plurality of resonators RT30, RT40, RT50, RT60, RT70 provided between resonator RT10 and resonator RT20.

Resonator RT10 corresponds to a "first resonator" or a "second resonator". Resonator RT10 includes a resonant portion RT11, a resonant portion RT12, a resonant portion RT13, and a capacitor C14 connected to resonant portion RT11 and resonant portion RT12.

Resonant portion RT11 corresponds to a "first resonant portion" or a "fourth resonator". As shown in FIG. 3, resonant portion RT11 includes an inductor L11 and a capacitor C11 connected in parallel between input terminal T1 and a ground terminal GND. One end of each of inductor L11 and capacitor C11 is connected to input terminal T1, and the other end of each of inductor L11 and capacitor C11 is connected to ground terminal GND. Inductor L11 includes a conductor (a via V11 described hereinafter) having a length of about ¼ of a wavelength $\lambda$ corresponding to a center frequency of a passband for a signal. Resonant portion RT11 is a $\lambda/4$ resonator.

Resonant portion RT12 corresponds to a "second resonant portion" or a "fifth resonator". Resonant portion RT12 includes an inductor L12 and a capacitor C12 connected in parallel between capacitor C14 and ground terminal GND. One end of capacitor C14 is connected to input terminal T1, and the other end of capacitor C14 is connected to one end of each of inductor L12 and capacitor C12. One end of each of inductor L12 and capacitor C12 is connected to input terminal T1 via capacitor C14, and the other end of each of inductor L12 and capacitor C12 is connected to ground terminal GND. Inductor L12 includes a conductor (a via V12 described hereinafter) having a length of about ¼ of wavelength $\lambda$ corresponding to a center frequency of a passband for a signal. Resonant portion RT12 is a $\lambda/4$ resonator.

Resonant portion RT13 corresponds to a "third resonant portion" or a "sixth resonator". Resonant portion RT13 includes an inductor L13 and a capacitor C13. One end of inductor L13 is connected to ground terminal GND, and the other end of inductor L13 is connected to one end of capacitor C13. The other end of capacitor C13 is connected to ground terminal GND. Inductor L13 includes a conductor (a via V13 described hereinafter) having a length of about ¼ of wavelength $\lambda$ corresponding to a center frequency of a passband for a signal. Resonant portion RT13 is a $\lambda/4$ resonator.

Resonator RT20 corresponds to the "first resonator" or the "second resonator". Resonator RT20 includes a resonant portion RT21, a resonant portion RT22, a resonant portion RT23, and a capacitor C24 connected to resonant portion RT21 and resonant portion RT22.

Resonant portion RT21 corresponds to the "first resonant portion" or a "fourth resonant portion". Resonant portion RT21 includes an inductor L21 and a capacitor C21 connected in parallel between output terminal T2 and ground terminal GND. One end of each of inductor L21 and capacitor C21 is connected to output terminal T2, and the other end of each of inductor L21 and capacitor C21 is connected to ground terminal GND. Inductor L21 includes a conductor (a via V21 described hereinafter) having a length of about ¼ of wavelength $\lambda$ corresponding to a center frequency of a passband for a signal. Resonant portion RT21 is a $\lambda/4$ resonator.

Resonant portion RT22 corresponds to the "second resonant portion" or a "fifth resonant portion". Resonant portion RT22 includes an inductor L22 and a capacitor C22 connected in parallel between capacitor C24 and ground terminal GND. One end of capacitor C24 is connected to output terminal T2, and the other end of capacitor C24 is connected to one end of each of inductor L22 and capacitor C22. One end of each of inductor L22 and capacitor C22 is connected to output terminal T2 via capacitor C24, and the other end of each of inductor L22 and capacitor C22 is connected to ground terminal GND. Inductor L22 includes a conductor (a via V22 described hereinafter) having a length of about ¼ of wavelength $\lambda$ corresponding to a center frequency of a passband for a signal. Resonant portion RT22 is a $\lambda/4$ resonator.

Resonant portion RT23 corresponds to the "third resonant portion" or a "sixth resonant portion". Resonant portion RT23 includes an inductor L23 and a capacitor C23. One end of inductor L23 is connected to ground terminal GND, and the other end of inductor L23 is connected to one end of capacitor C23. The other end of capacitor C23 is connected to ground terminal GND. Inductor L23 includes a conductor (a via V23 described hereinafter) having a length of about ¼ of wavelength $\lambda$ corresponding to a center frequency of a passband for a signal. Resonant portion RT23 is a $\lambda/4$ resonator.

Resonator RT30 corresponds to an "intermediate resonator". Resonator RT30 includes a capacitor C31, an inductor L31, and a capacitor C32 connected in series. One end of capacitor C31 is connected to ground terminal GND, and the other end of capacitor C31 is connected to one end of inductor L31. One end of capacitor C32 is connected to ground terminal GND, and the other end of capacitor C32 is connected to the other end of inductor L31. Inductor L31 includes a conductor (a via V31 described hereinafter) having a length of about ½ of wavelength $\lambda$ corresponding to a center frequency of a passband for a signal. Resonator RT30 is a $\lambda/2$ resonator.

Resonator RT40 corresponds to the "intermediate resonator". Resonator RT40 includes a capacitor C41, an inductor L41, and a capacitor C42 connected in series. One end of capacitor C41 is connected to ground terminal GND, and the other end of capacitor C41 is connected to one end of inductor L41. One end of capacitor C42 is connected to ground terminal GND, and the other end of capacitor C42 is connected to the other end of inductor L41. Inductor L41 includes a conductor (a via V41 described hereinafter) having a length of about ½ of wavelength $\lambda$ corresponding to a center frequency of a passband for a signal. Resonator RT40 is a $\lambda/2$ resonator.

Resonator RT50 corresponds to the "intermediate resonator". Resonator RT50 includes a capacitor C51, an inductor L51, and a capacitor C52 connected in series. One end of capacitor C51 is connected to ground terminal GND, and the other end of capacitor C51 is connected to one end of inductor L51. One end of capacitor C52 is connected to ground terminal GND, and the other end of capacitor C32 is connected to the other end of inductor L51. Inductor L51 includes a conductor (a via V51 described hereinafter) having a length of about ½ of wavelength $\lambda$ corresponding to a center frequency of a passband for a signal. Resonator RT50 is a $\lambda/2$ resonator.

Resonator RT60 corresponds to the "intermediate resonator". Resonator RT60 includes a capacitor C61, an inductor L61, and a capacitor C62 connected in series. One end of capacitor C61 is connected to ground terminal GND, and the other end of capacitor C61 is connected to one end of inductor L61. One end of capacitor C62 is connected to ground terminal GND, and the other end of capacitor C62 is connected to the other end of inductor L61. Inductor L61 includes a conductor (a via V61 described hereinafter) having a length of about ½ of wavelength λ corresponding to a center frequency of a passband for a signal. Resonator RT60 is a λ/2 resonator.

Resonator RT70 corresponds to the "intermediate resonator". Resonator RT70 includes a capacitor C71, an inductor L71, and a capacitor C72 connected in series. One end of capacitor C71 is connected to ground terminal GND, and the other end of capacitor C71 is connected to one end of inductor L71. One end of capacitor C72 is connected to ground terminal GND, and the other end of capacitor C72 is connected to the other end of inductor L71. Inductor L71 includes a conductor (a via V71 described hereinafter) having a length of about ½ of wavelength λ corresponding to a center frequency of a passband for a signal. Resonator RT70 is a λ/2 resonator.

As shown in FIG. 2, resonant portion RT11 and resonant portion RT12 of resonator RT10 are coupled by inductive coupling M1. Resonant portion RT21 and resonant portion RT22 of resonator RT20 are coupled by inductive coupling M2. Resonant portion RT13 of resonator RT10 and resonator RT30 are coupled by inductive coupling M3. Resonator RT30 and resonator RT40 are coupled by inductive coupling M4. Resonator RT40 and resonator RT50 are coupled by inductive coupling M5. Resonator RT50 and resonator RT60 are coupled by inductive coupling M6. Resonator RT60 and resonator RT70 are coupled by inductive coupling M7. Resonator RT70 and resonant portion RT23 of resonator RT20 are coupled by inductive coupling M8. Further, resonator RT40 and resonator RT60 are coupled by inductive coupling M9.

Internal Configuration of Filter Device 100

Figure 4:
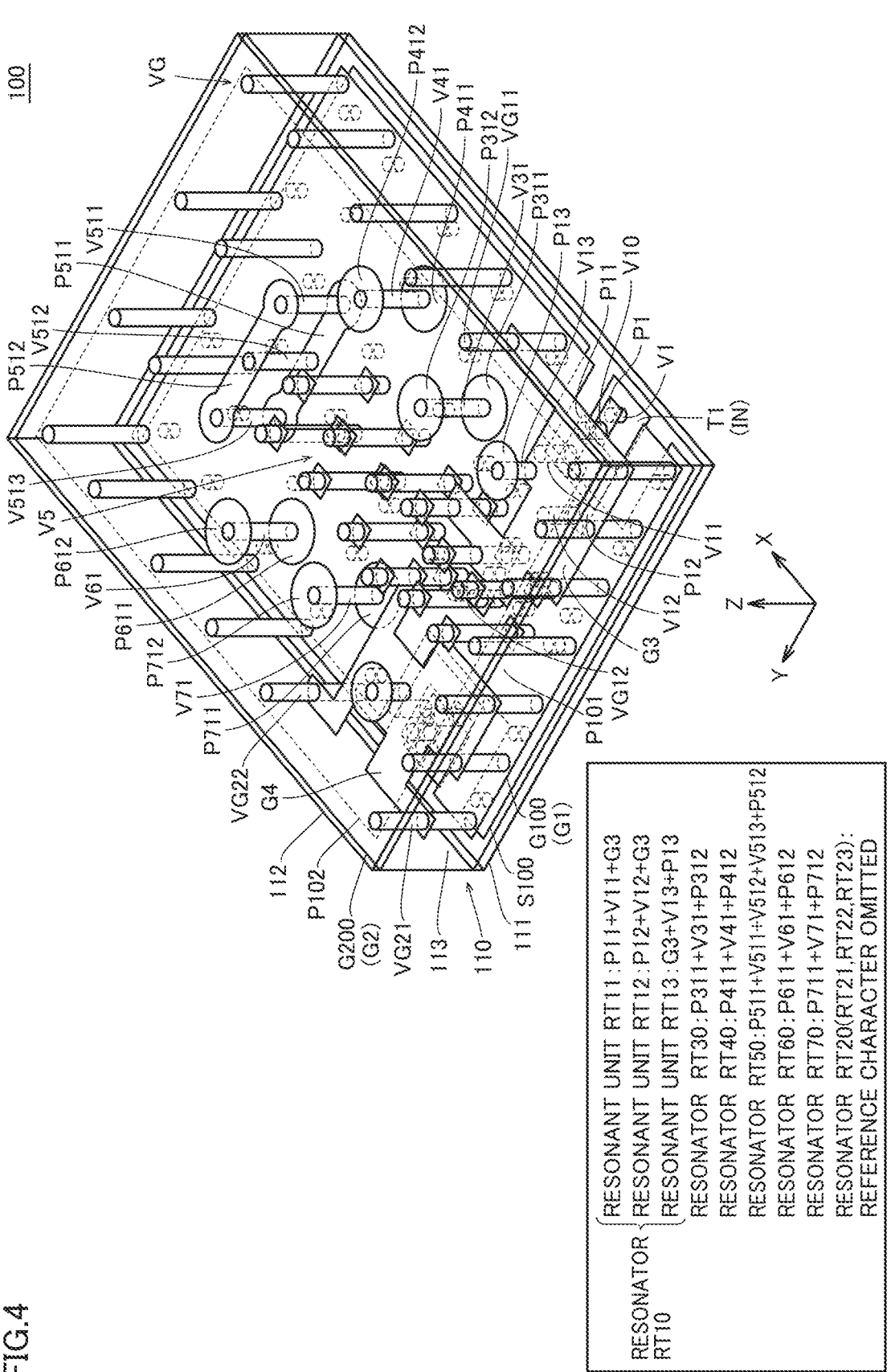
FIG. 4 is a perspective view of the filter device according to the first preferred embodiment of the present invention.
Figure 5:
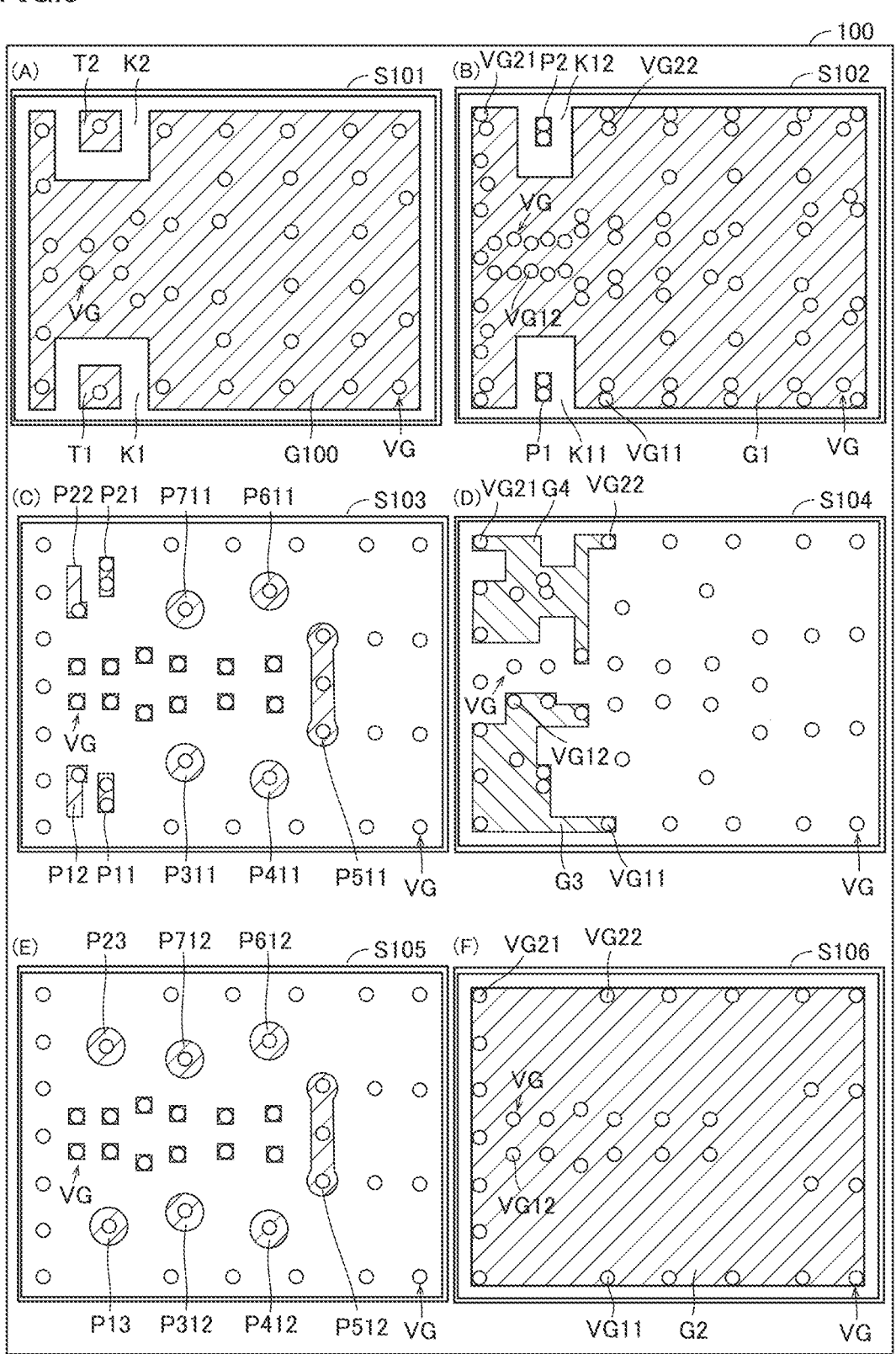
FIG. 5 is a plan view showing an example of each stacked layer of the filter device according to the first preferred embodiment of the present invention.
Figure 6:
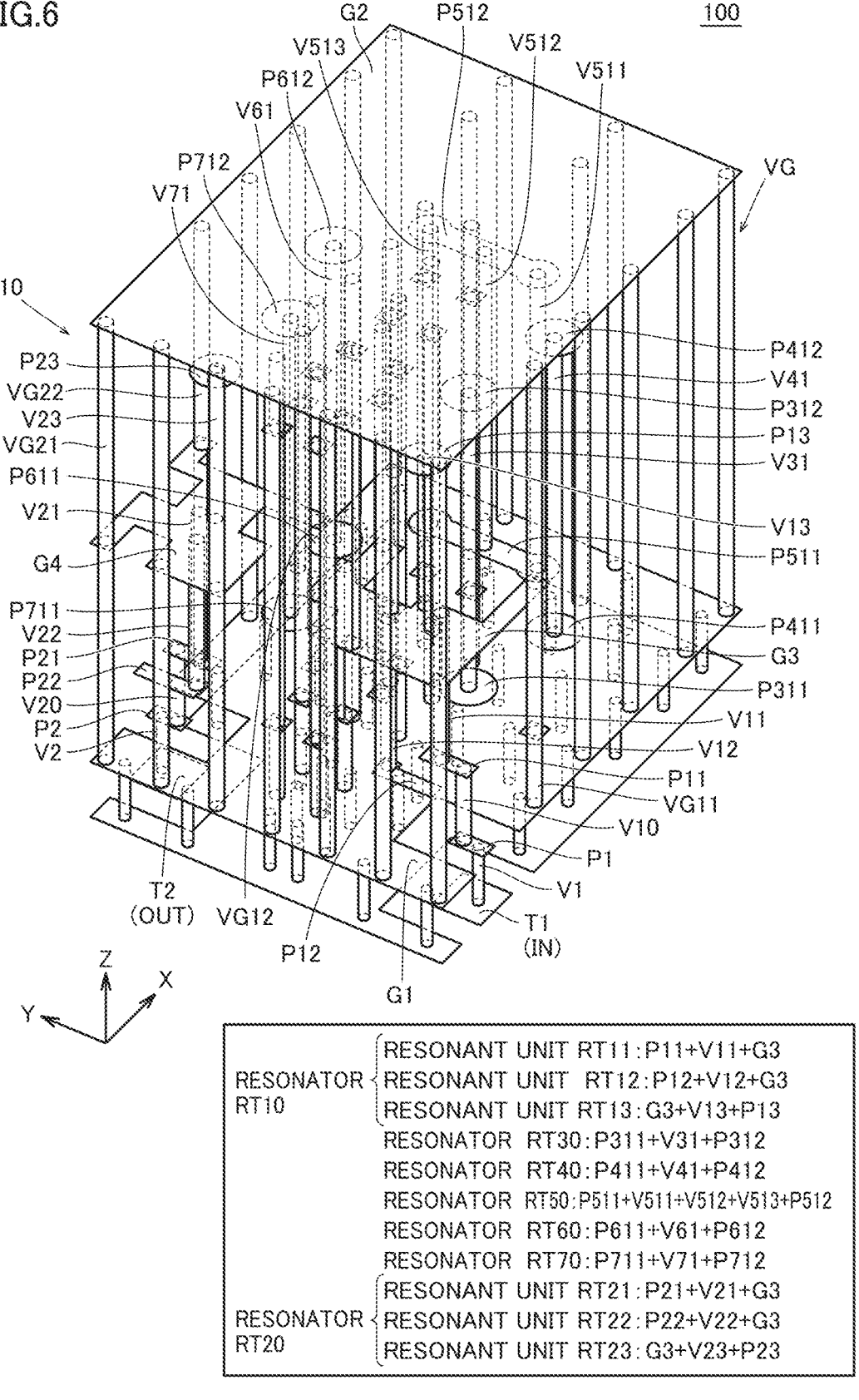
FIG. 6 is an exploded perspective view showing an example of a stack structure of the filter device according to the first preferred embodiment of the present invention.

An internal configuration of filter device 100 according to the first preferred embodiment will now be described with reference to FIGS. 4 to 6. FIG. 4 is a perspective view of filter device 100 according to the first preferred embodiment. FIG. 5 is a plan view showing an example of each stacked layer of filter device 100 according to the first preferred embodiment. FIG. 6 is an exploded perspective view showing an example of a stack structure of filter device 100 according to the first preferred embodiment.

Filter device 100 includes a rectangular parallelepiped or substantially rectangular parallelepiped dielectric substrate 110 including a plurality of dielectric layers that are stacked in a predetermined direction. For dielectric substrate 110, a direction in which the plurality of dielectric layers are stacked is referred to as a stacking direction. Each dielectric layer in dielectric substrate 110 is made of a dielectric ceramic such as, for example, low temperature co-fired ceramics (LTCC), or a dielectric material such as, for example, quartz or resin. Inside dielectric substrate 110, a plurality of electrodes and a plurality of vias define resonators RT10 to RT70. In the present specification, the term "via" refers to a conductor provided in the dielectric substrate in order to connect a plurality of electrodes having different positions in the stacking direction. The via includes conductive paste, plating, and/or metal pins, for example.

In the following description, the stacking direction of dielectric substrate 110 is referred to as a "Z-axis direction," a direction perpendicular or substantially perpendicular to the Z-axis direction and along a longer side of dielectric substrate 110 is referred to as an "X-axis direction," and a direction perpendicular or substantially perpendicular to the Z-axis direction and along a shorter side of dielectric substrate 110 is referred to as a "Y-axis direction". Hereinafter, in each figure, a positive direction along the Z-axis may be referred to as an upper side and a negative direction along the Z-axis may be referred to as a lower side.

In FIG. 4 to FIG. 6, and FIG. 7 described hereinafter, in order to show the internal configuration, the dielectric of dielectric substrate 110 is not shown, and only conductors such as internally provided electrodes (planar electrodes and ground electrodes), vias, and terminals are shown.

Referring to FIGS. 4 to 6, dielectric substrate 110 includes a lower surface 111 and an upper surface 112 extending in the XY direction, and a side surface 113 interconnecting a peripheral edge of lower surface 111 and a peripheral edge of upper surface 112. Dielectric substrate 110 includes a first layer 5101 (FIG. 5(A)), a second layer 5102 (FIG. 5(B)), a third layer 5103 (FIG. 5(C)), a fourth layer 5104 (FIG. 5(D)), a fifth layer 5105 (FIG. 5(E)), and a sixth layer 5106 (FIG. 5(F)) disposed in this order from lower surface 111 toward upper surface 112 in the positive direction along the Z axis.

In first layer 5101, a ground electrode G100 corresponding to ground terminal GND, input terminal T1, and output terminal T2 are provided. Ground electrode G100 includes two notches K1 and K2, and input terminal T1 is provided in notch K1 and output terminal T2 is provided in notch K2. Input terminal T1, output terminal T2, and ground terminal GND each define and function as an external terminal to connect filter device 100 to an external device.

Second layer 5102 includes a ground electrode G1 corresponding to ground terminal GND. Ground electrode G1 corresponds to a "first ground electrode". Ground electrode G1 includes two notches K11 and K12, and a planar electrode P1 is provided in notch K11, and a planar electrode P2 is provided in notch K12.

When viewed in a direction perpendicular or substantially perpendicular to dielectric substrate 110 (or the Z-axis direction), notches K11, K12 of second layer 5102 overlap notches K1, K2 of first layer 5101, respectively. When viewed in the direction perpendicular or substantially perpendicular to dielectric substrate 110 (or the Z-axis direction), planar electrode P1 provided in notch K11 of second layer 5102 is provided at a position overlapping input terminal T1 provided in notch K1 of first layer 5101. When viewed in the direction perpendicular or substantially perpendicular to dielectric substrate 110 (or the Z-axis direction), planar electrode P2 provided in notch K12 of second layer 5102 is provided at a position overlapping output terminal T2 provided in notch K2 of first layer 5101.

Third layer 5103 includes planar electrodes P11 and P12 located closer to input terminal T1, and planar electrodes P21 and P22 located closer to output terminal T2. When viewed in the direction perpendicular or substantially perpendicular to dielectric substrate 110 (or the Z-axis direction), planar electrodes P11 and P12 are provided at positions overlapping input terminal T1 and planar electrode P1. When viewed in the direction perpendicular or substantially perpendicular to dielectric substrate 110 (or the Z-axis direction), planar electrodes P21 and P22 are provided at positions overlapping output terminal T2 and planar electrode P2. Planar electrodes P11, P12, P21, and P22 are not connected to ground electrode G1 and instead are spaced from ground electrode G1.

Further, third layer 5103 includes planar electrodes P311, P411, P511, P611, and P711. Planar electrodes P311, P411, P511, P611, and P711 each correspond to a "first planar electrode". Planar electrodes P311, P411, P511, P611, and P711 are not connected to ground electrode G1, and instead spaced away from ground electrode G1 so as to face ground electrode G1.

Fourth layer 5104 includes a ground electrode G3 and a ground electrode G4 corresponding to ground terminal GND. Ground electrodes G3 and G4 each correspond to a "first intermediate ground electrode" or a "second intermediate ground electrode". Ground electrode G3 is disposed closer to input terminal T1, whereas ground electrode G4 is disposed closer to output terminal T2. When viewed in the direction perpendicular or substantially perpendicular to dielectric substrate 110 (or the Z-axis direction), ground electrode G3 is provided at a position overlapping input terminal T1, planar electrode P1, and planar electrodes P11 and P12. When viewed in the direction perpendicular or substantially perpendicular to dielectric substrate 110 (or the Z-axis direction), ground electrode G4 is provided at a position overlapping output terminal T2, planar electrode P2, and planar electrodes P21 and P22.

Fifth layer 5105 includes planar electrodes P13, P23, P312, P412, P512, P612, and P712. Planar electrodes P312, P412, P512, P612, and P712 each correspond to a "second planar electrode". Planar electrodes P13, P23, P312, P412, P612, and P712 are not connected to a ground electrode G2 described hereinafter, and instead are spaced away from ground electrode G2 so as to face ground electrode G2.

Sixth layer 5106 includes ground electrode G2 corresponding to ground terminal GND. Ground electrode G2 is disposed opposite to ground electrode G1. Ground electrode G2 corresponds to a "second ground electrode".

Dielectric substrate 110 includes a plurality of ground vias VG. Each ground via VG is a columnar conductor extending in the Z-axis direction, and is connected to a ground electrode of each of first layer 5101 to sixth layer 5106. For example, ground electrode G1 of the second layer, ground electrode G2 of the second layer, and ground electrode G3 of the fourth layer are connected by a plurality of (seven in this example) ground vias VG including ground vias VG11 and VG12. Ground electrode G1 of the second layer, ground electrode G2 of the second layer, and ground electrode G4 of the fourth layer are connected by a plurality of (five in this example) ground vias VG including ground vias VG21 and VG22.

As shown in FIGS. 4 and 6, a via V1 extending in the Z-axis direction is provided between input terminal T1 and planar electrode P1. Via V1 interconnects input terminal T1 and planar electrode P1.

A via V10 extending in the Z-axis direction is provided between planar electrode P1 and planar electrode P11. Via V10 interconnects planar electrode P1 and planar electrode P11.

A via V11 extending in the Z-axis direction is provided between planar electrode P11 and ground electrode G3. Via V11 corresponds to a "first conductor", and interconnects planar electrode P11 and ground electrode G3.

A via V12 extending in the Z-axis direction is provided between planar electrode P12 and ground electrode G3. Via V12 corresponds to the "first conductor", and interconnects planar electrode P12 and ground electrode G3.

A via V13 extending in the Z-axis direction is provided between ground electrode G3 and planar electrode P13. Via V13 corresponds to the "first conductor", and interconnects ground electrode G3 and planar electrode P13.

Resonant portion RT11 of resonator RT10 shown in FIGS. 2 and 3 is provided between ground electrode G1 and ground electrode G3, and is connected to ground electrode G3 and input terminal T1. Specifically, resonant portion RT11 includes planar electrode P11, ground electrode G3 facing planar electrode P11, and via V11 interconnecting planar electrode P11 and ground electrode G3. Inductor L11 shown in FIG. 3 includes via V11. Capacitor C11 shown in FIG. 3 includes planar electrode P11 and ground electrode G1.

Resonant portion RT12 of resonator RT10 shown in FIGS. 2 and 3 is provided between ground electrode G1 and ground electrode G3, and is connected to ground electrode G3. Resonant portion RT12 is not connected to input terminal T1. Specifically, resonant portion RT12 includes planar electrode P12, ground electrode G3 facing planar electrode P12, and via V12 interconnecting planar electrode P12 and ground electrode G3. Inductor L12 of FIG. 3 includes via V12. Capacitor C12 shown in FIG. 3 includes planar electrode P12 and ground electrode G1.

Resonant portion RT13 of resonator RT10 shown in FIGS. 2 and 3 is provided between ground electrode G2 and ground electrode G3, and is connected to ground electrode G3. Specifically, resonant portion RT13 includes ground electrode G3, planar electrode P13 facing ground electrode G3, and via V13 interconnecting ground electrode G3 and planar electrode P13. Inductor L13 in FIG. 3 includes via V13. Since planar electrode P13 is not connected to ground electrode G2, a local capacitance is created between planar electrode P13 and ground electrode G2. Capacitor C13 shown in FIG. 3 includes planar electrode P13 and ground electrode G2.

A via V2 extending in the Z-axis direction is provided between output terminal T2 and planar electrode P2. Via V2 interconnects output terminal T2 and planar electrode P2.

A via V20 extending in the Z-axis direction is provided between planar electrode P2 and planar electrode P21. Via V20 interconnects planar electrode P2 and planar electrode P21.

A via V21 extending in the Z-axis direction is provided between planar electrode P21 and ground electrode G4. Via V21 corresponds to the "first conductor", and interconnects planar electrode P21 and ground electrode G4.

A via V22 extending in the Z-axis direction is provided between planar electrode P22 and ground electrode G4. Via V22 corresponds to the "first conductor", and interconnects planar electrode P22 and ground electrode G4.

A via V23 extending in the Z-axis direction is provided between ground electrode G4 and planar electrode P23. Via V23 corresponds to the "first conductor", and interconnects ground electrode G4 and planar electrode P23.

Resonant portion RT21 of resonator RT20 shown in FIGS. 2 and 3 is provided between ground electrode G1 and ground electrode G4, and is connected to ground electrode G4 and output terminal T2. Specifically, resonant portion RT21 includes planar electrode P21, ground electrode G4 facing planar electrode P21, and via V21 interconnecting planar electrode P21 and ground electrode G4. Inductor L21 shown in FIG. 3 includes via V21. Capacitor C21 shown in FIG. 3 includes planar electrode P21 and ground electrode G1.

Resonant portion RT22 of resonator RT20 shown in FIGS. 2 and 3 is provided between ground electrode G1 and ground electrode G4 and is connected to ground electrode G4. Resonant portion RT22 is not connected to output terminal T2. Specifically, resonant portion RT22 includes planar electrode P22, ground electrode G4 facing planar electrode P22, and via V22 interconnecting planar electrode P22 and ground electrode G4. Inductor L22 of FIG. 3 includes via V22. Capacitor C22 shown in FIG. 3 includes planar electrode P22 and ground electrode G1.

Resonant portion RT23 of resonator RT20 shown in FIGS. 2 and 3 is provided between ground electrode G2 and ground electrode G4 and is connected to ground electrode G4. Specifically, resonant portion RT23 includes ground electrode G4, planar electrode P23 facing ground electrode G4, and via V23 interconnecting ground electrode G4 and planar electrode P23. Inductor L23 shown in FIG. 3 includes via V23. Since planar electrode P23 is not connected to ground electrode G2, a local capacitance is created between planar electrode P23 and ground electrode G2. Capacitor C23 shown in FIG. 3 includes planar electrode P23 and ground electrode G2.

A via V31 extending in the Z-axis direction is provided between planar electrode P311 and planar electrode P312. Via V31 corresponds to a "second conductor", and interconnects planar electrode P311 and planar electrode P312.

A via V41 extending in the Z-axis direction is provided between planar electrode P411 and planar electrode P412. Via V41 corresponds to the "second conductor", and interconnects planar electrode P411 and planar electrode P412.

Vias V511, V512, and V513 extending in the Z-axis direction are provided between planar electrode P511 and planar electrode P512. Vias V511, V512, and V513 correspond to the "second conductor", and interconnect planar electrode P511 and planar electrode P512.

A via V61 extending in the Z-axis direction is provided between planar electrode P611 and planar electrode P612. Via V61 corresponds to the "second conductor", and interconnects planar electrode P611 and planar electrode P612.

A via V71 extending in the Z-axis direction is provided between planar electrode P711 and planar electrode P712. Via V71 corresponds to the "second conductor", and interconnects planar electrode P711 and planar electrode P712.

Resonator RT30 shown in FIGS. 2 and 3 is provided between ground electrode G1 and ground electrode G2. Specifically, resonator RT30 includes planar electrode P311, planar electrode P312 facing planar electrode P311, and via V31 interconnecting planar electrode P311 and planar electrode P312. Inductor L31 shown in FIG. 3 includes via V31. Since planar electrode P311 is not connected to ground electrode G1, a local capacitance is generated between planar electrode P311 and ground electrode G1. Capacitor C31 shown in FIG. 3 includes planar electrode P311 and ground electrode G1. Since planar electrode P312 is not connected to ground electrode G2, a local capacitance is generated between planar electrode P312 and ground electrode G2. Capacitor C32 shown in FIG. 3 includes planar electrode P312 and ground electrode G2.

Resonator RT40 shown in FIGS. 2 and 3 is provided between ground electrode G1 and ground electrode G2. Specifically, resonator RT40 includes planar electrode P411, planar electrode P412 facing planar electrode P411, and via V41 interconnecting planar electrode P411 and planar electrode P412. Inductor L41 shown in FIG. 3 includes via V41. Since planar electrode P411 is not connected to ground electrode G1, a local capacitance is generated between planar electrode P411 and ground electrode G1. Capacitor C41 shown in FIG. 3 includes planar electrode P411 and ground electrode G1. Since planar electrode P412 is not connected to ground electrode G2, a local capacitance is generated between planar electrode P412 and ground electrode G2. Capacitor C42 shown in FIG. 3 includes planar electrode P412 and ground electrode G2.

Resonator RT50 shown in FIGS. 2 and 3 is provided between ground electrode G1 and ground electrode G2. Specifically, resonator RT50 includes planar electrode P511, planar electrode P512 facing planar electrode P511, and vias V511 to V513 interconnecting planar electrode P511 and planar electrode P512. Inductor L51 shown in FIG. 3 includes vias V511 to V513. Since planar electrode P511 is not connected to ground electrode G1, a local capacitance is generated between planar electrode P511 and ground electrode G1. Capacitor C51 shown in FIG. 3 includes planar electrode P511 and ground electrode G1. Since planar electrode P512 is not connected to ground electrode G2, a local capacitance is generated between planar electrode P512 and ground electrode G2. Capacitor C52 shown in FIG. 3 includes planar electrode P512 and ground electrode G2.

Resonator RT50 is in the form of a loop with vias V511 to V513 connected in parallel between planar electrode P511 and planar electrode P512. For resonator RT50 in such a loop, the inductor provided in resonator RT50 has an increased air core diameter, and can have a Q value that is improved for a given size of dielectric substrate 110. Alternatively, dielectric substrate 110 can be reduced in size while a Q value is maintained.

Resonator RT60 shown in FIGS. 2 and 3 is provided between ground electrode G1 and ground electrode G2. Specifically, resonator RT60 includes planar electrode P611, planar electrode P612 facing planar electrode P611, and via V61 interconnecting planar electrode P611 and planar electrode P612. Inductor L61 shown in FIG. 3 includes via V61. Since planar electrode P611 is not connected to ground electrode G1, a local capacitance is generated between planar electrode P611 and ground electrode G1. Capacitor C61 shown in FIG. 3 includes planar electrode P611 and ground electrode G1. Since planar electrode P612 is not connected to ground electrode G2, a local capacitance is generated between planar electrode P612 and ground electrode G2. Capacitor C62 shown in FIG. 3 includes planar electrode P612 and ground electrode G2.

Resonator RT70 shown in FIGS. 2 and 3 is provided between ground electrode G1 and ground electrode G2. Specifically, resonator RT70 includes planar electrode P711, planar electrode P712 facing planar electrode P711, and via V71 interconnecting planar electrode P711 and planar electrode P712. Inductor L71 shown in FIG. 3 includes via V71. Since planar electrode P711 is not connected to ground electrode G1, a local capacitance is generated between planar electrode P711 and ground electrode G1. Capacitor C71 shown in FIG. 3 includes planar electrode P711 and ground electrode G1. Since planar electrode P712 is not connected to ground electrode G2, a local capacitance is generated between planar electrode P712 and ground electrode G2. Capacitor C72 shown in FIG. 3 includes planar electrode P712 and ground electrode G2.

As described above, resonator RT10 is connected to input terminal T1, and resonator RT20 is connected to output terminal T2. Resonators RT10, RT30, RT40, and RT50 are disposed in this order in a positive direction along the X axis. Resonators RT50, RT60, RT70 and RT20 are disposed in this order in a negative direction along the X axis. Further, resonators RT10 and RT20 are adjacent in the Y-axis direction, and so are resonators RT30 and RT70, and resonators RT40 and RT60.

In other words, a path from resonator RT10 to resonator RT20 via resonator RT30, resonator RT40, resonator RT50, resonator RT60, and resonator RT70 is axisymmetrically turned around resonator RT50.

Resonators RT10 to RT70 are each a resonator with the TE101 mode defining and functioning as a fundamental mode, and a signal is transmitted in a resonance mode in which an electric field has a direction in the Z-axis direction and a magnetic field rotates in a direction of a plane along the XY plane.

Adjacent resonators are coupled by inductive coupling or capacitive coupling. It is generally known that capacitive coupling occurs when a distance between adjacent resonators in a direction of an electric field in a coupling window (that is, a distance in the Z-axis direction) is reduced, whereas inductive coupling occurs when a distance therebetween in a direction orthogonal or substantially orthogonal to the direction of the electric field in the coupling window is reduced.

In filter device 100, a local capacitance is generated between planar electrode P11 of resonant portion RT11 and planar electrode P12 of resonant portion RT12. Capacitor C14 shown in FIG. 3 includes planar electrode P11 and planar electrode P12. A local capacitance is generated between planar electrode P21 of resonant portion RT21 and planar electrode P22 of resonant portion RT22. Capacitor C24 shown in FIG. 3 includes planar electrode P21 and planar electrode P22.

Inductive coupling M1 is generated between via V11 of resonant portion RT11 and via V12 of resonant portion RT12. Inductive coupling M2 is generated between via V21 of resonant portion RT21 and via V22 of resonant portion RT22. Inductive coupling M3 is generated between via V13 of resonant portion RT13 and via V31 of resonator RT30. Inductive coupling M4 is generated between via V31 of resonator RT30 and via V41 of resonator RT40. Inductive coupling M5 is generated between via V41 of resonator RT40 and via V51 of resonator RT50. Inductive coupling M6 is generated between via V51 of resonator RT50 and via V61 of resonator RT60. Inductive coupling M7 is generated between via V61 of resonator RT60 and via V71 of resonator RT70. Inductive coupling M8 is generated between via V71 of resonator RT70 and via V23 of resonant portion RT23. Inductive coupling M9 is generated between via V41 of resonator RT40 and via V61 of resonator RT60.

Transmission Characteristic of Resonator

Figure 7:
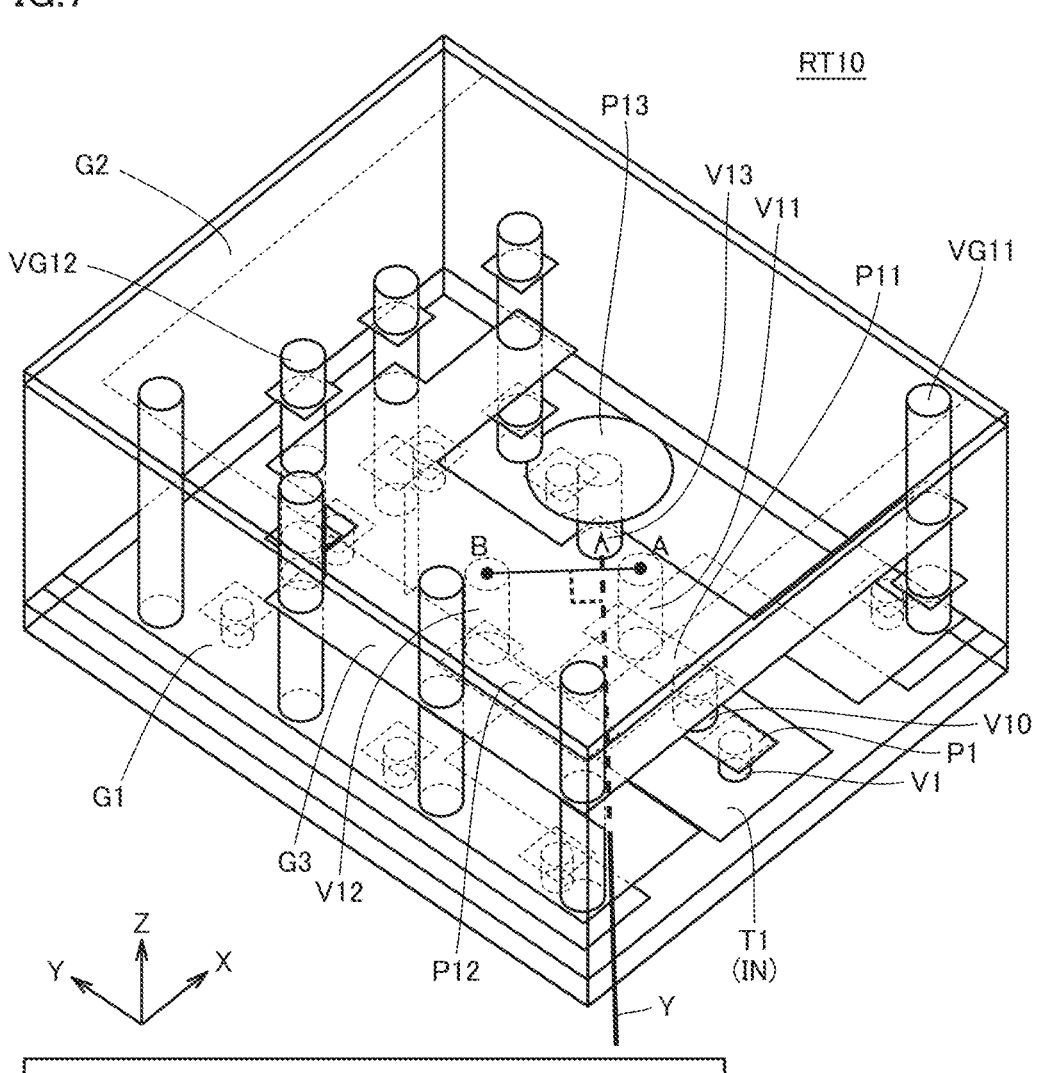
FIG. 7 is a perspective view of a resonator connected to an input terminal according to a preferred embodiment of the present invention.
Figure 8:
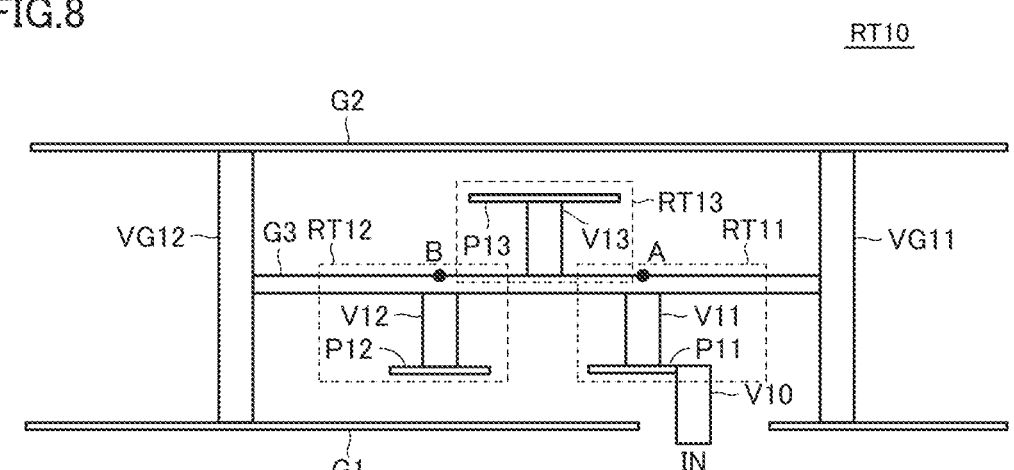
FIG. 8 is a diagram schematically showing a positional relationship of each resonant portion in a resonator connected to an input terminal according to a preferred embodiment of the present invention.

Resonator RT10 has a transmission characteristic, as will now be described with reference to FIGS. 7 to 13. FIG. 7 is a perspective view of resonator RT10 connected to input terminal T1. FIG. 8 is a diagram schematically showing a positional relationship of resonant portions RT11 to RT13 in resonator RT10 connected to input terminal T1. FIG. 8, and FIG. 10, FIG. 12, FIG. 16, FIG. 18, FIG. 21 and FIG. 24 described hereinafter schematically shows positional relationships of resonant portions RT11 to RT13 when resonator RT10 is viewed in a direction that is orthogonal or substantially orthogonal to a path interconnecting a position A symmetrical or substantially symmetrical to resonant portion RT11 with respect to ground electrode G3 and a position B symmetrical or substantially symmetrical to resonant portion RT12 with respect to ground electrode G3 and is also orthogonal to the Z-axis (that is, a direction of an arrow Y indicated in FIG. 7, or a direction of a side surface of filter device 100).

Referring to FIGS. 7 and 8, resonant portion RT11 includes planar electrode P11, ground electrode G3 facing planar electrode P11, and via V11 interconnecting planar electrode P11 and ground electrode G3. One end of via V11 is connected to ground electrode G3, and the other end of via V11 is connected to input terminal T1 by via V10. Resonant portion RT12 includes planar electrode P12, ground electrode G3 facing planar electrode P12, and via V12 interconnecting planar electrode P12 and ground electrode G3. One end of via V12 is connected to ground electrode G3, and the other end of via V12 is an open end. Resonant portion RT13 includes planar electrode P12, ground electrode G3 facing planar electrode P12, and via V12 interconnecting planar electrode P12 and ground electrode G3. One end of via V12 is connected to ground electrode G3, and the other end of via V12 is an open end.

As shown in FIG. 8, when resonator RT10 is viewed in the direction of arrow Y indicated in FIG. 7, resonant portion RT13 is provided on the path interconnecting position A symmetrical or substantially symmetrical to resonant portion RT11 with respect to ground electrode G3 and position B symmetrical or substantially symmetrical to resonant portion RT12 with respect to ground electrode G3. In other words, when resonator RT10 is viewed from the side surface in the direction orthogonal or substantially orthogonal to the path interconnecting position A and position B (or the direction of arrow Y), resonant portion RT13 is disposed between position A and position B.

Figure 9:
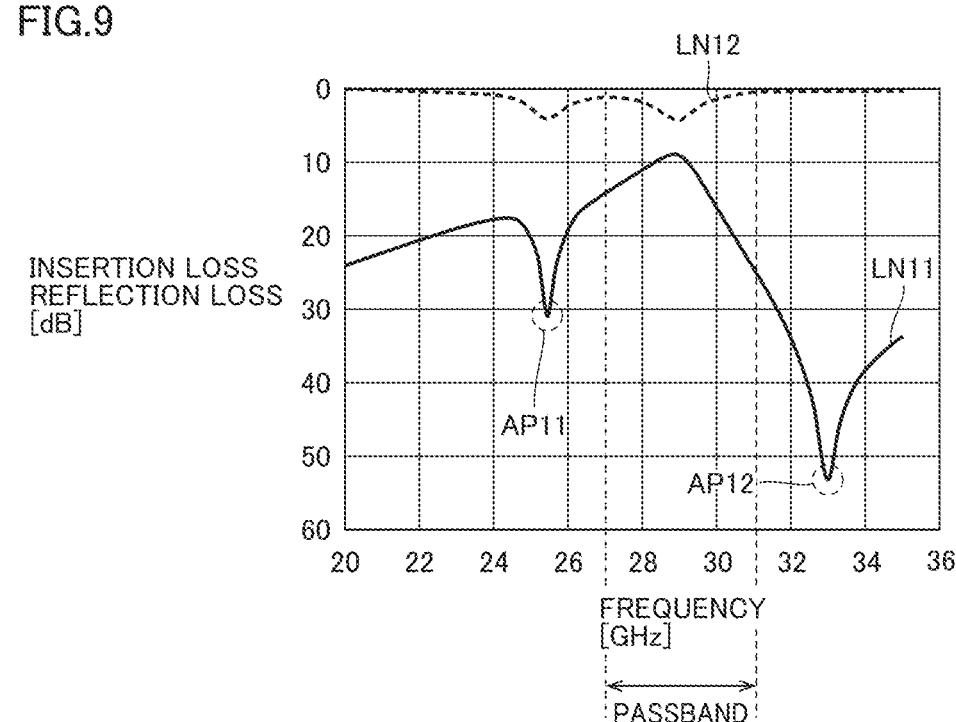
FIG. 9 is a diagram representing a transmission characteristic of the resonator of FIG. 8.

FIG. 9 is a diagram representing a transmission characteristic of resonator RT10 of FIG. 8. In FIG. 9, the horizontal axis represents frequency, and the vertical axis represents insertion loss (a solid line LN11) and reflection loss (a broken line LN12). FIG. 9 represents a transmission characteristic when a signal only passes through resonator RT10, and does not consider transmission characteristics of the other resonators RT20 to RT70.

Referring to FIG. 9, for resonator RT10, one attenuation pole AP11 is generated on a lower frequency side than a passband, and one attenuation pole AP12 is generated on a higher frequency side than the passband. Specifically, attenuation pole AP11 is generated on a lower frequency side than a passband set around 29 GHz for a signal, that is, for example, around 25 GHz, and attenuation pole AP12 is generated on a higher frequency side than the passband, that is, for example, around 33 GHz.

Figure 10:
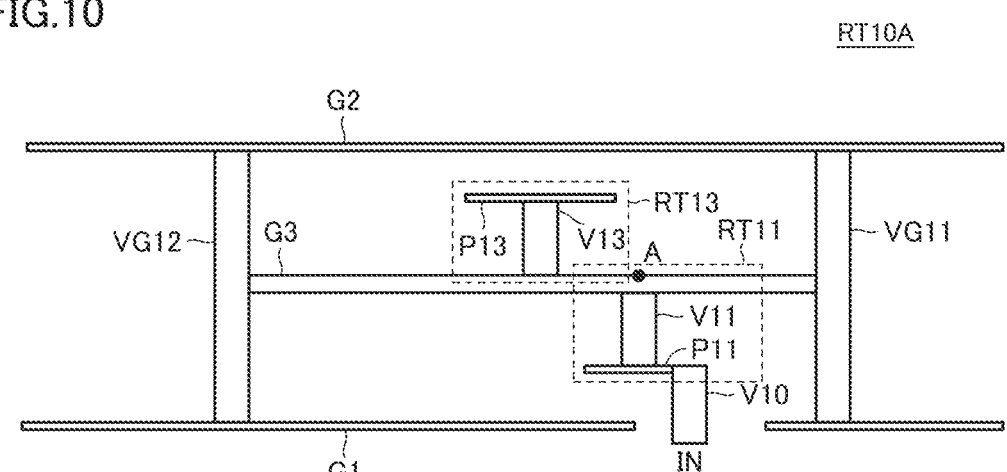
FIG. 10 is a diagram showing an example in which a number of resonant portions is reduced in a resonator connected to an input terminal according to a preferred embodiment of the present invention.

FIG. 10 is a diagram showing an example in which the number of resonant portions is reduced in resonator RT10 connected to input terminal T1. In the example shown in FIG. 10, resonator RT10 with resonant portion RT12 removed is shown as a resonator RT10A. As shown in FIG. 10, resonator RT10A includes resonant portion RT11 provided between ground electrode G1 and ground electrode G3 and connected to ground electrode G3 and input terminal T1, and resonant portion RT13 provided between ground electrode G2 and ground electrode G3 and connected to ground electrode G3.

Figure 11:
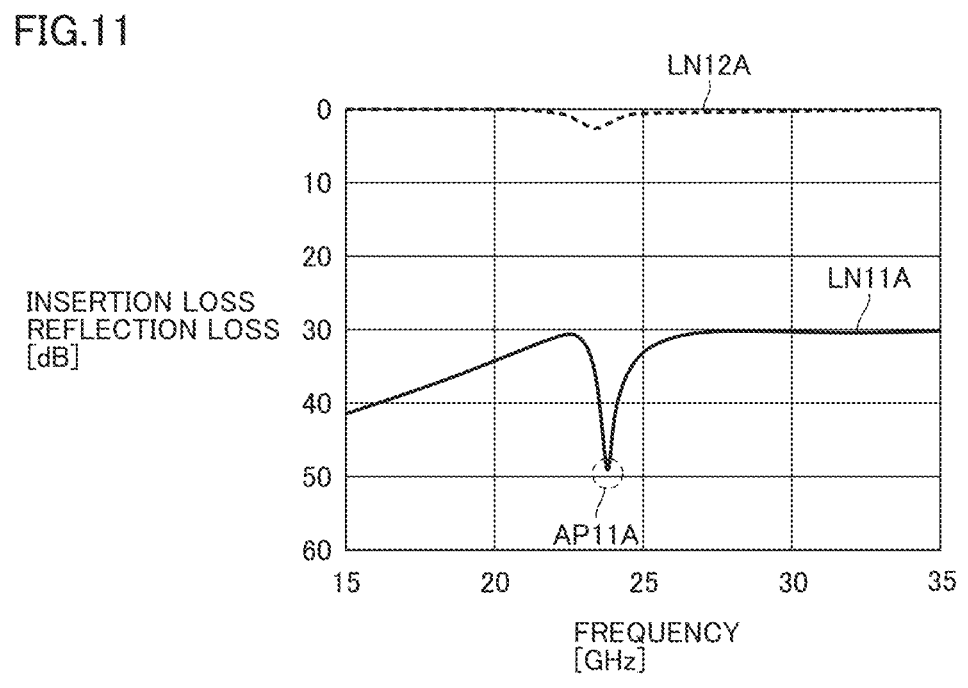

FIG. 11 is a diagram representing a transmission characteristic of resonator RT10A of FIG. 10. In FIG. 11, the horizontal axis represents frequency, and the vertical axis represents insertion loss (a solid line LN11A) and reflection loss (a broken line LN12A). Note that FIG. 11 represents a transmission characteristic when a signal only passes through resonator RT10A, and does not consider transmission characteristics of the other resonators RT20 to RT70.

Referring to FIG. 11, for resonator RT10A, one attenuation pole AP11A is generated on a lower frequency side than a passband, that is, for example, around 24 GHz. From this, it is understood that one lower-frequency-side attenuation pole (AP11 in FIGS. 9 and AP11A in FIG. 11) is generated by an effect of resonant portion RT11 provided between ground electrode G1 and ground electrode G3 and resonant portion RT13 provided between ground electrode G2 and ground electrode G3.

Figure 12:
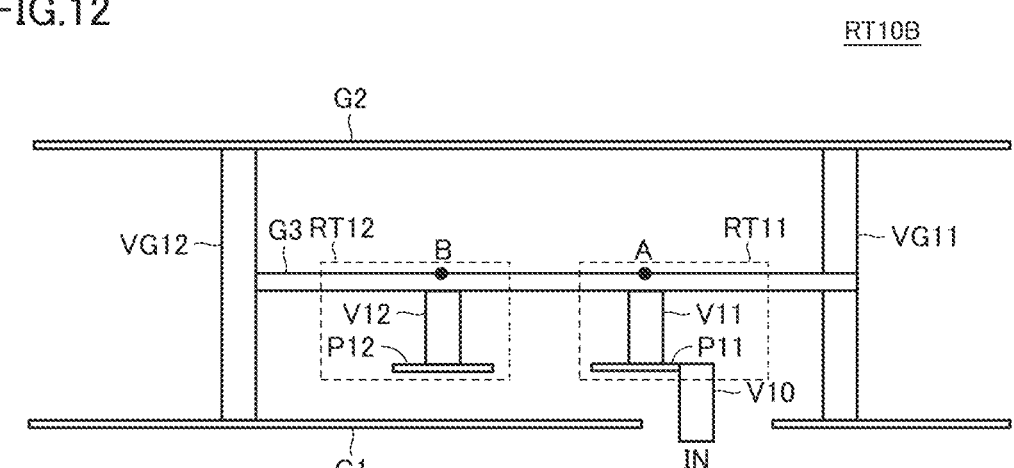
FIG. 12 is a diagram showing an example in which a number of resonant portions is reduced in a resonator connected to an input terminal according to a preferred embodiment of the present invention.

FIG. 12 is a diagram showing an example in which the number of resonant portions is reduced in resonator RT10 connected to input terminal T1. In the example shown in FIG. 12, resonator RT10 with resonant portion RT13 removed is shown as a resonator RT10B. As shown in FIG. 12, resonator RT10B includes resonant portion RT11 provided between ground electrode G1 and ground electrode G3 and connected to ground electrode G3 and input terminal T1, and resonant portion RT12 provided between ground electrode G1 and ground electrode G3 and connected to ground electrode G3.

Figure 13:
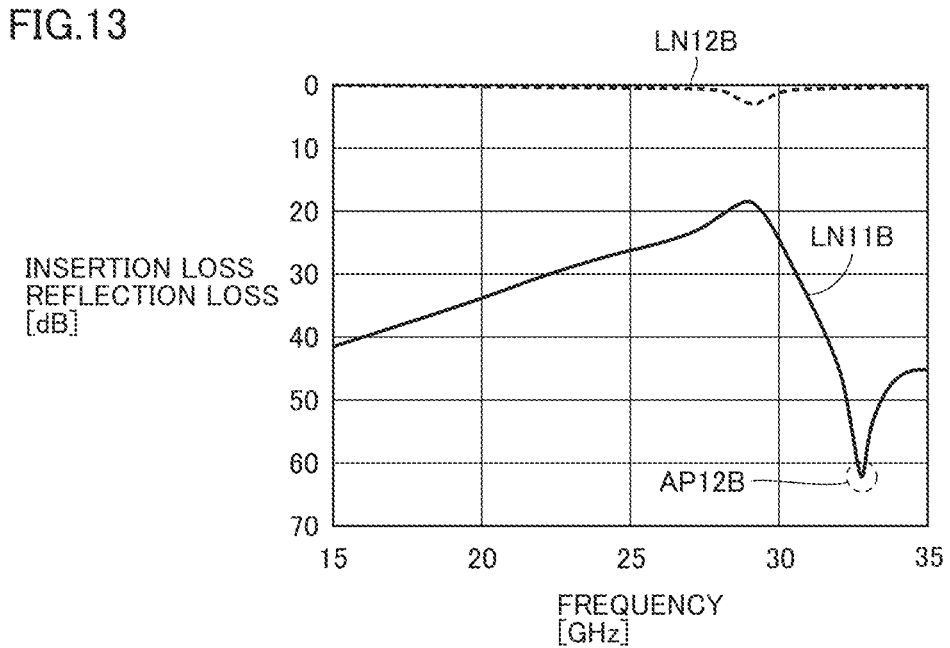
FIG. 13 is a diagram representing a transmission characteristic of the resonator of FIG. 12.

FIG. 13 is a diagram representing a transmission characteristic of resonator RT10B of FIG. 12. In FIG. 13, the horizontal axis represents frequency, and the vertical axis represents insertion loss (a solid line LN11B) and reflection loss (a broken line LN12B). FIG. 13 represents a transmission characteristic when a signal only passes through resonator RT10B, and does not consider transmission characteristics of the other resonators RT20 to RT70.

Referring to FIG. 13, for resonator RT10B, one attenuation pole AP12B is generated on a higher frequency side than a passband, that is, for example, around 33 GHz. From this, it is understood that one high-frequency-side attenuation pole (AP12 in FIGS. 9 and AP12B in FIG. 13) is generated by an effect of resonant portion RT11 provided between ground electrode G1 and ground electrode G3 and resonant portion RT12 provided between ground electrode G1 and ground electrode G3.

As shown in FIGS. 10 to 13, for resonator RT10, one lower-frequency-side attenuation pole is generated by an effect of resonant portion RT11 and resonant portion RT13, and one higher-frequency-side attenuation pole is generated by an effect of resonant portion RT11 and resonant portion RT12.

Transmission Characteristic of Filter Device

Figure 14:
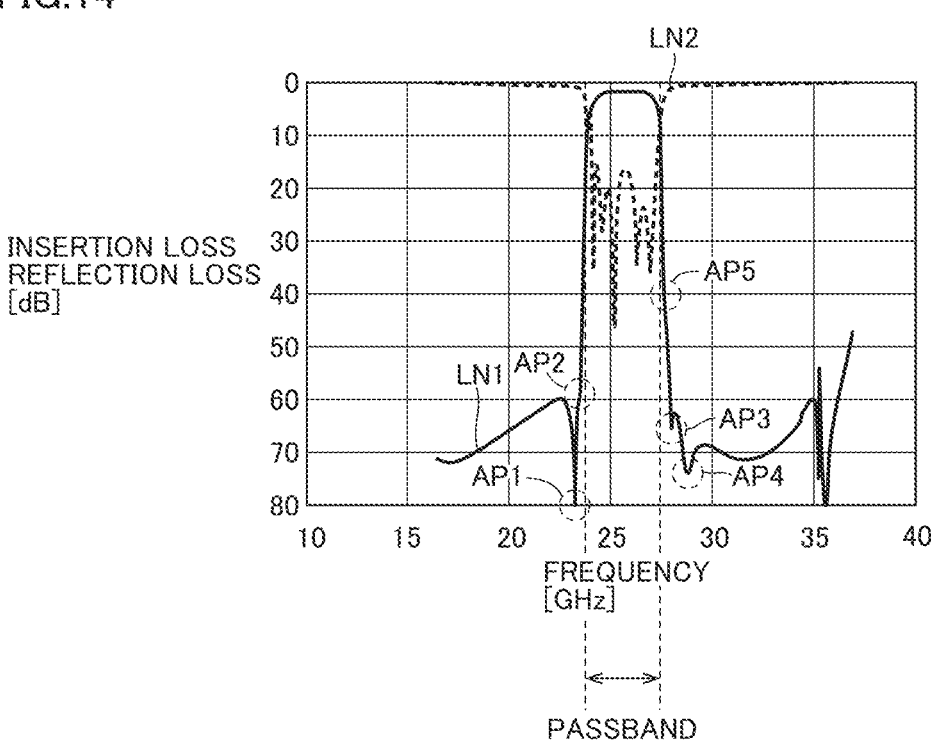
FIG. 14 represents a transmission characteristic of the filter device according to the first preferred embodiment of the present invention.
Figure 15:
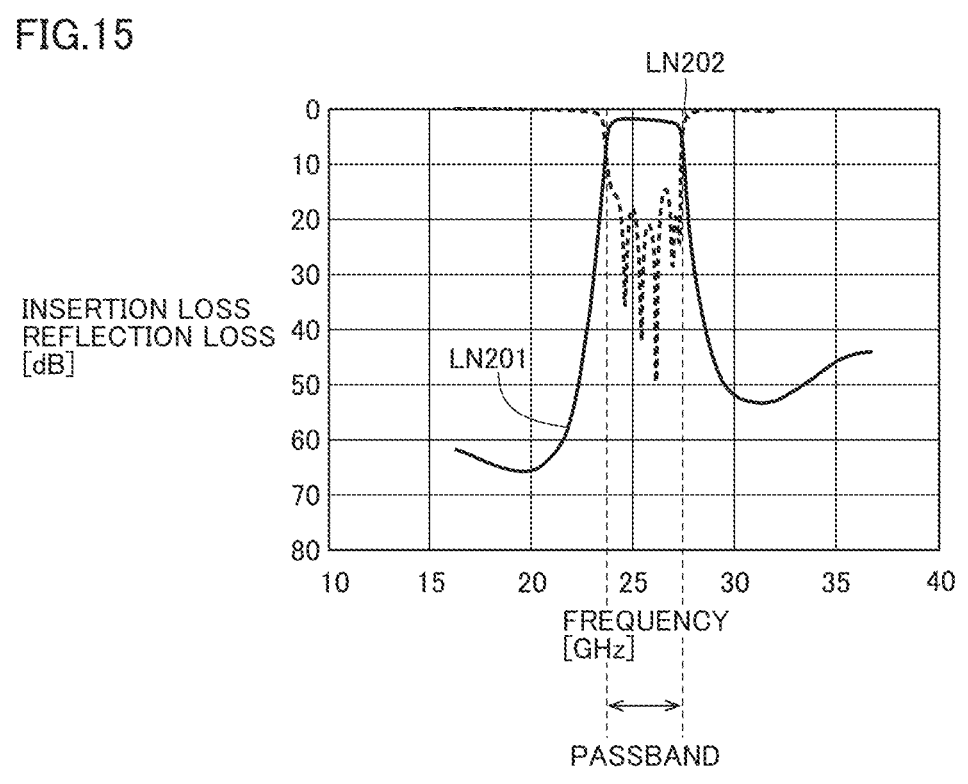

Filter device 100's transmission characteristic will now be described with reference to FIGS. 14 and 15 in comparison with a transmission characteristic of a filter device of a comparative example. FIG. 14 represents the transmission characteristic of filter device 100 according to the first preferred embodiment. FIG. 15 represents the transmission characteristic of the filter device of the comparative example.

The filter device of the comparative example does not include resonator RT10 including three λ/4 resonators as filter device 100 of the first preferred embodiment does, and instead includes one λ/2 resonator between input terminal T1 and ground electrode G2. Specifically, in the filter device of the comparative example, a resonator closer to input terminal T1 includes a via coupled to input terminal T1 by capacitive coupling and having a length of about ½ of wavelength λ corresponding to a center frequency of a passband, and a planar electrode facing ground electrode G2 and connected to that via. Furthermore, the filter device of the comparative example does not include resonator RT20 including three λ/4 resonators as filter device 100 of the first preferred embodiment does, and instead includes one λ/2 resonator between output terminal T2 and ground electrode G2. Specifically, in the filter device of the comparative example, a resonator closer to output terminal T2 includes a via coupled to output terminal T2 by capacitive coupling and having a length of about ½ of wavelength λ corresponding to the center frequency of the passband, and a planar electrode facing ground electrode G2 and connected to that via.

In FIGS. 14 and 15, the horizontal axis represents frequency, and the vertical axis represents insertion loss (solid lines LN1 and LN201) and reflection loss (broken lines LN2 and LN202). FIGS. 14 and 15 represents a passband of about 24.25 GHz to about 27.5 GHz, for example.

Referring to FIGS. 14 and 15, in the filter device of the comparative example, no attenuation pole is generated in either a lower frequency side than the passband or a higher frequency side than the passband. In contrast, in filter device 100 of the first preferred embodiment, two attenuation poles AP1 and AP2 are generated on the lower frequency side than the passband, and three attenuation poles AP3, AP4 and AP5 are generated on the higher frequency side than the passband.

As described with reference to FIGS. 10 and 11, attenuation pole AP1 is mainly generated by an effect of resonant portion RT11 and resonant portion RT13 of resonator RT10. Attenuation pole AP2 is mainly generated by an effect of resonant portion RT21 and resonant portion RT23 of resonator RT20. As described with reference to FIGS. 12 and 13, attenuation pole AP3 is mainly generated by an effect of resonant portion RT11 and resonant portion RT12 of resonator RT10. Attenuation pole AP4 is mainly generated by an effect of resonant portion RT21 and resonant portion RT22 of resonator RT20. It is believed that attenuation pole AP5 is mainly generated by inductive coupling M9 caused between resonator RT40 and resonator RT60.

Thus, in filter device 100 of the first preferred embodiment, an attenuation pole is generated on each of the higher and lower frequency sides than the passband by each of resonator RT10 connected to input terminal T1 and resonator RT20 connected to output terminal T2.

Further, by positionally adjusting resonant portion RT13 in resonator RT10 and resonant portion RT23 in resonator RT20, attenuation pole AP1 generated by the resonance of resonator RT10 and attenuation pole AP2 generated by the resonance of resonator RT20 can be matched in frequency. Thus, both attenuation pole AP1 generated by the resonance of resonator RT10 and attenuation pole AP2 generated by the resonance of resonator RT20 can attenuate a signal at the attenuation poles on the lower frequency side to a greater extent.

It is understood that, in filter device 100 of the first preferred embodiment, an attenuation characteristic of steeper and higher attenuation than the filter device of the comparative example can be obtained on the lower and higher frequency sides than the passband by the attenuation poles AP1 to AP5. In particular, in filter device 100, two attenuation poles are generated on the lower frequency side than the passband, and accordingly, an attenuation characteristic with high steepness on the lower frequency side is obtained, and further, three attenuation poles are generated on the higher frequency side than the passband, and accordingly, an attenuation characteristic with high steepness on the higher frequency side is obtained.

Further, filter device 100 includes resonators RT10 to RT70 defining a transmission line by using vias, and can reduce insertion loss more than a resonator defining a transmission line by using a strip line.

Thus, filter device 100 of the first preferred embodiment enables a passband for a signal to be appropriately adjusted and improves an attenuation characteristic in a non-passband.

Exemplary Variation

Figure 16:
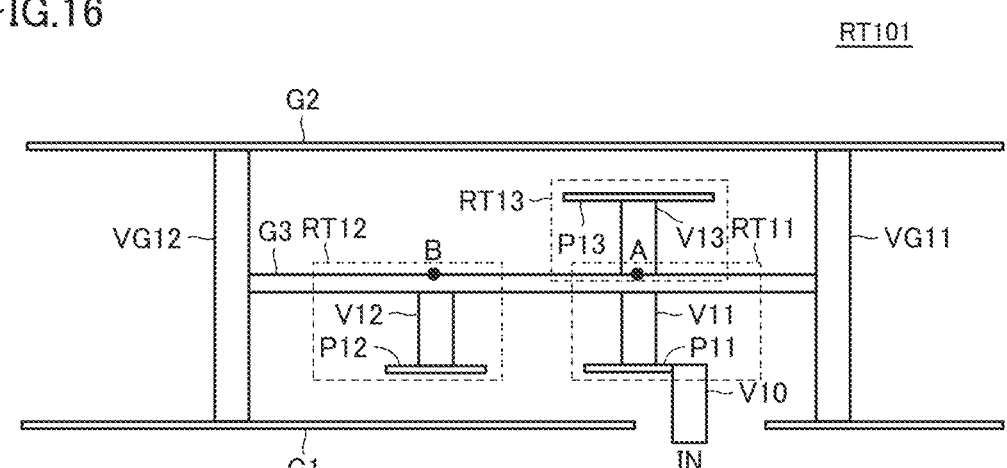
FIG. 16 is a diagram schematically showing a positional relationship of each resonant portion in a resonator according to an exemplary variation of a preferred embodiment of the present invention.

An exemplary variation of the resonator of the first preferred embodiment will now be described with reference to FIGS. 16 to 23. FIG. 16 is a diagram schematically showing a positional relationship of each resonant portion RT11 to RT13 in a resonator RT101 of an exemplary variation. In the example of FIG. 16, when resonator RT10 is viewed in the direction of arrow Y indicated in FIG. 7, resonant portion RT13 is provided at position A symmetrical or substantially symmetrical to resonant portion RT11 with respect to ground electrode G3.

Figure 17:
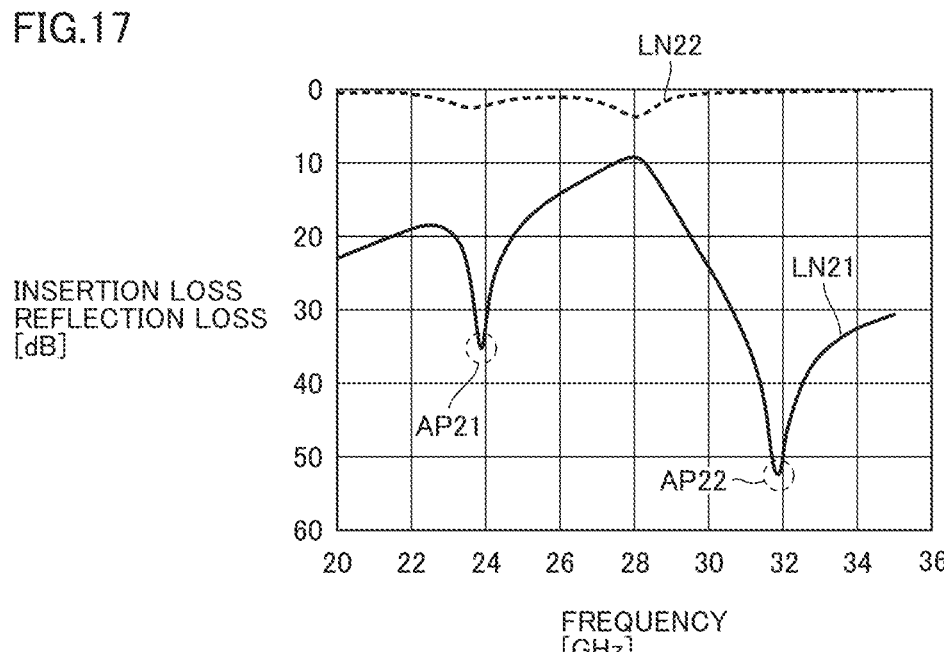
FIG. 17 is a diagram representing a transmission characteristic of the resonator of FIG. 16.

FIG. 17 is a diagram representing a transmission characteristic of resonator RT101 of FIG. 16. In FIG. 17, the horizontal axis represents frequency, and the vertical axis represents insertion loss (a solid line LN21) and reflection loss (a broken line LN22). FIG. 17 represents a transmission characteristic when a signal only passes through resonator RT101, and does not consider transmission characteristics of the other resonators RT20 to RT70.

Referring to FIG. 17, in resonator RT101, one attenuation pole AP21 is generated on a lower frequency side than a passband, and one attenuation pole AP22 is generated on a higher frequency side than a passband. Specifically, attenuation pole AP21 is generated on a lower frequency side than a passband set around 29 GHz for a signal, that is, for example, around 24 GHz, and attenuation pole AP22 is generated on a higher frequency side than the passband, that is, for example, around 32 GHz.

Figure 18:
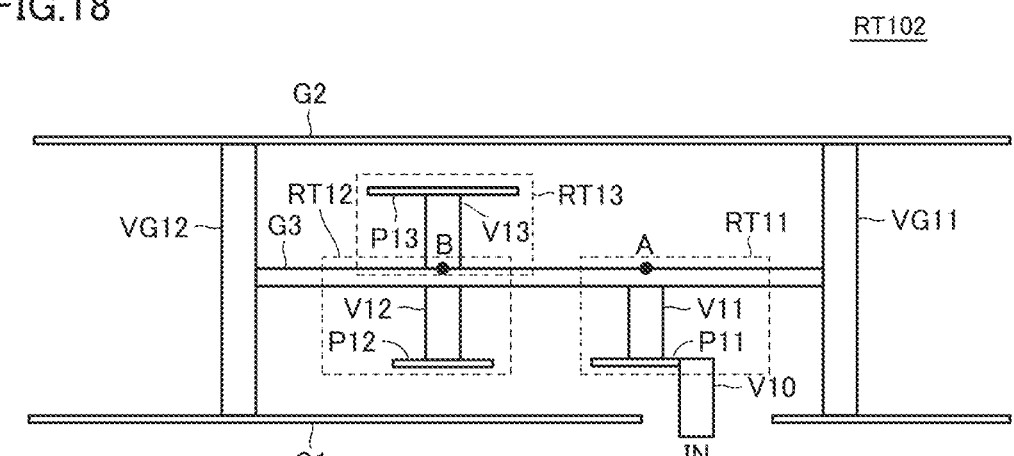
FIG. 18 is a diagram schematically showing a positional relationship of each resonant portion in the resonator according to the exemplary variation.

FIG. 18 is a diagram schematically showing a positional relationship of each resonant portion RT11 to RT13 in a resonator RT102 of an exemplary variation. In the example of FIG. 18, when resonator RT102 is viewed in the direction of arrow Y indicated in FIG. 7, resonant portion RT13 is provided at position B symmetrical or substantially symmetrical to resonant portion RT12 with respect to ground electrode G3.

Figure 19:
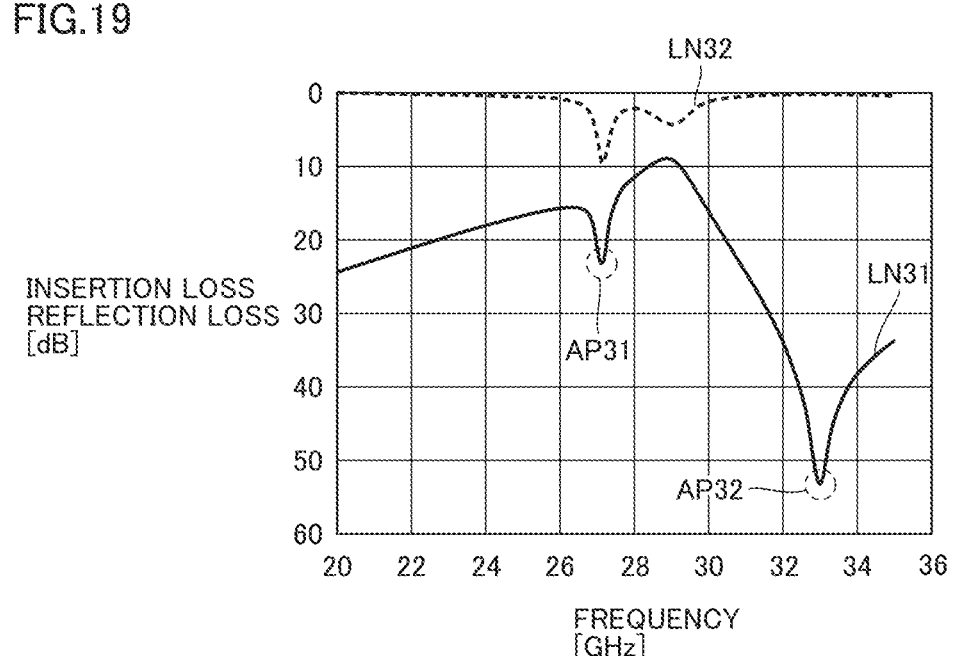
FIG. 19 is a diagram representing a transmission characteristic of the resonator of FIG. 18.

FIG. 19 is a diagram representing a transmission characteristic of resonator RT102 of FIG. 18. In FIG. 19, the horizontal axis represents frequency, and the vertical axis represents insertion loss (a solid line LN31) and reflection loss (a broken line LN32). FIG. 19 represents a transmission characteristic when a signal only passes through resonator RT102, and does not consider transmission characteristics of the other resonators RT20 to RT70.

Referring to FIG. 19, in resonator RT102, one attenuation pole AP31 is generated on a lower frequency side than a passband, and one attenuation pole AP32 is generated on a higher frequency side than the passband. Specifically, attenuation pole AP31 is generated on a lower frequency side than a passband set around 29 GHz for a signal, that is, for example, around 27 GHz, and attenuation pole AP32 is generated on a higher frequency side than the passband, that is, for example, around 33 GHz.

Figure 20:
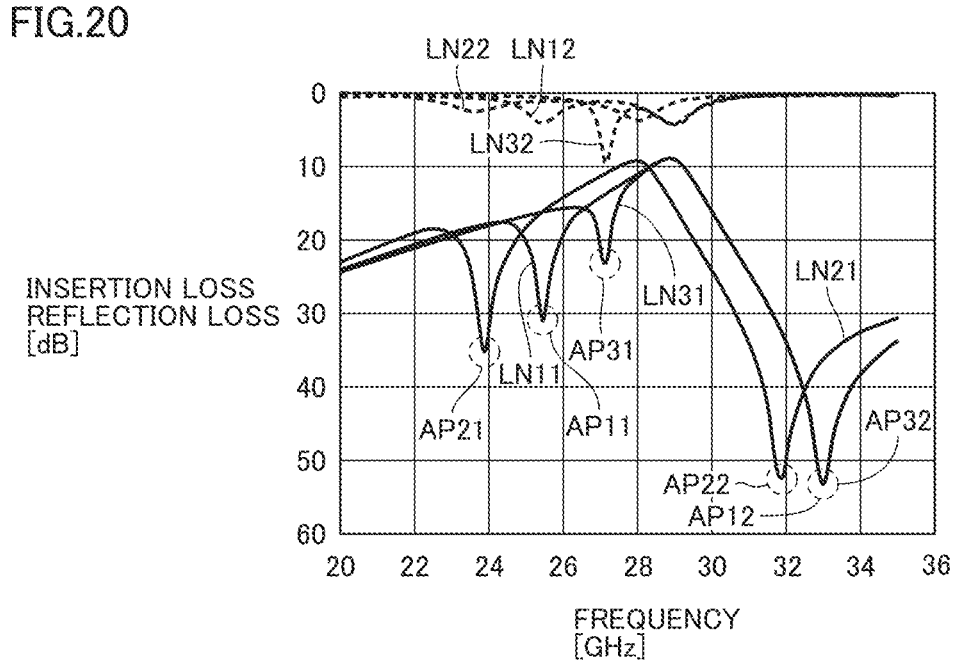
FIG. 20 is a diagram for comparing the transmission characteristics of the resonators represented in FIGS. 8, 16 and 18.

FIG. 20 is a diagram for comparing the transmission characteristics of resonators RT represented in FIGS. 8, 16 and 18. Referring to FIG. 20, it can be seen that as resonant portion RT13 approaches position A (or resonant portion RT11), an attenuation pole on a low frequency side moves toward a lower frequency side, and as resonant portion RT13 approaches position B (or resonant portion RT12), an attenuation pole on a lower frequency side moves toward a higher frequency side.

Figure 21:
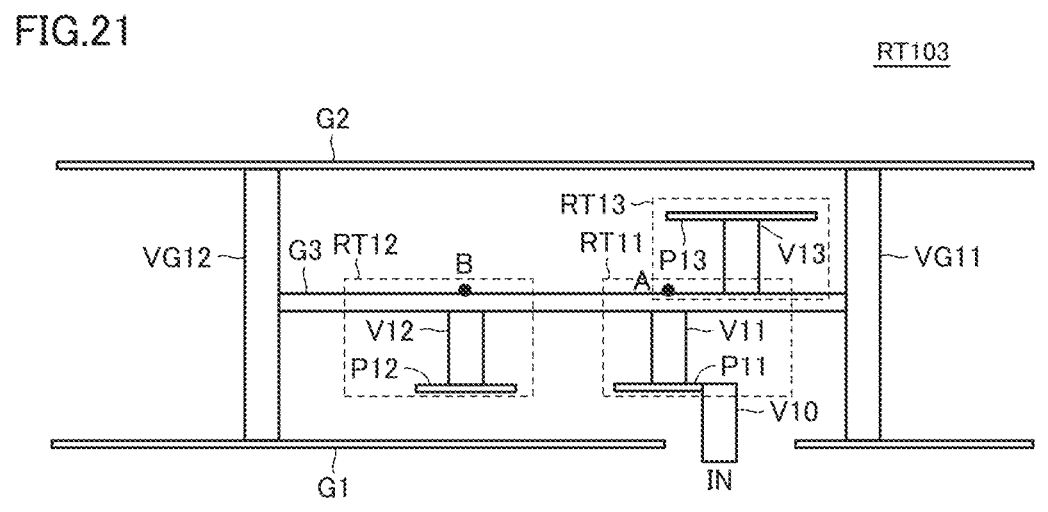

FIG. 21 is a diagram schematically showing a positional relationship of each resonant portion in a resonator RT103 of an exemplary variation. In the example of FIG. 21, when resonator RT103 is viewed in the direction of arrow Y indicated in FIG. 7, resonant portion RT13 is provided at a position different from the path interconnecting position A symmetrical or substantially symmetrical to resonant portion RT11 with respect to ground electrode G3 and position B symmetrical or substantially symmetrical to resonant portion RT12 with respect to ground electrode G3. In other words, when resonator RT103 is viewed in the direction of arrow Y indicated in FIG. 7, resonant portion RT13 is disposed outer than a region between resonant portion RT11 and resonant portion RT12.

Figure 22:
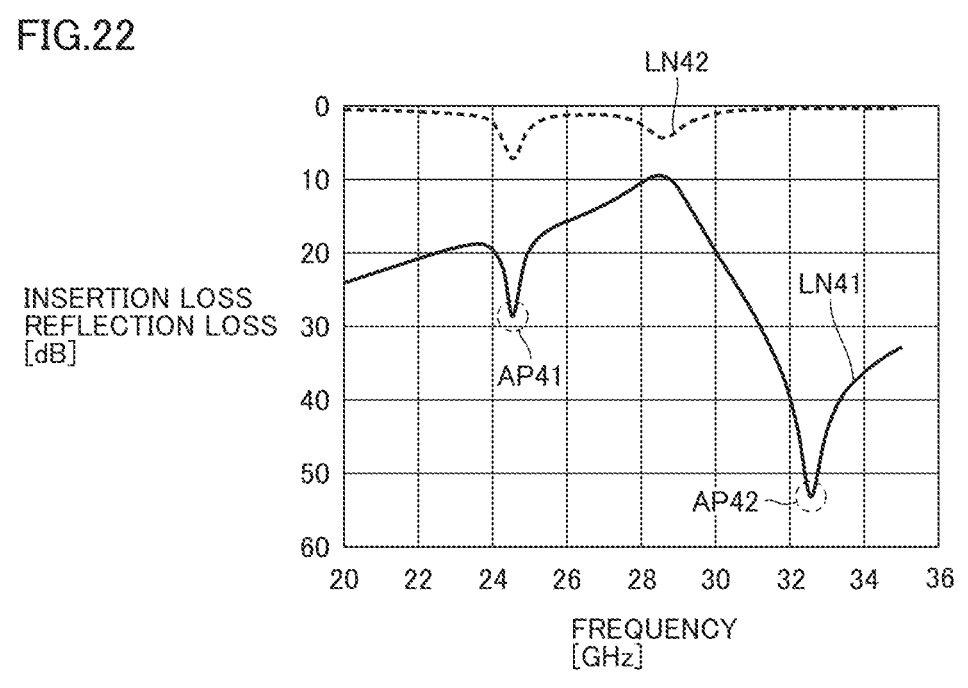

FIG. 22 is a diagram representing a transmission characteristic of resonator RT103 of FIG. 21. In FIG. 22, the horizontal axis represents frequency, and the vertical axis represents insertion loss (a solid line LN31) and reflection loss (a broken line LN32). FIG. 22 represents a transmission characteristic when a signal only passes through resonator RT103, and does not consider transmission characteristics of the other resonators RT20 to RT70.

Referring to FIG. 22, in resonator RT103, one attenuation pole AP41 is generated on a lower frequency side than a passband, and one attenuation pole AP42 is generated on a higher frequency side than the passband. Specifically, attenuation pole AP41 is generated on a lower frequency side than a passband set around 29 GHz for a signal, that is, for example, around 24 GHz, and attenuation pole AP42 is generated on a higher frequency side than the passband, that is, for example, around 32 GHz.

Figure 23:
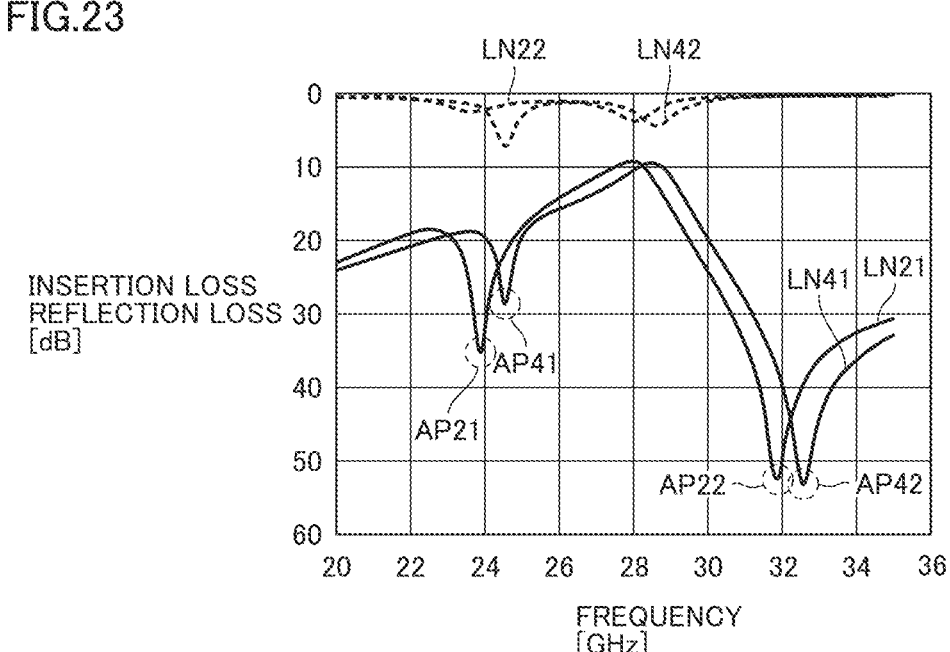
FIG. 23 is a diagram for comparing the transmission characteristics of the resonators represented in FIGS. 16 and 21.

FIG. 23 is a diagram for comparing the transmission characteristics of the resonators represented in FIGS. 16 and 21. Referring to FIG. 23, it can be seen that when resonant portion RT13 is moved from position A (or resonant portion RT11) away from position B, an attenuation pole on a lower frequency side moves toward a higher frequency side.

Considering the transmission characteristics of FIGS. 20 and 23, it is understood that when resonant portion RT13 is moved from position B toward position A, an attenuation pole on a low frequency side moves toward a lower frequency side, and when resonant portion RT13 is moved from position A away from position B, an attenuation pole on a lower frequency side returns toward a higher frequency side.

Thus, in resonator RT10, when resonant portion RT13 positionally changes, a frequency at which an attenuation pole on a lower frequency side is generated changes. Thus, by positionally changing resonant portion RT13 in resonator RT10, a passband can be appropriately adjusted so that a passband for a signal in filter device 100 is a desired passband.

Although FIGS. 7 to 23 show and represent configurations of a resonator connected to input terminal T1 and the resonator's transmission characteristics, it can be said that resonator RT20 connected to output terminal T2 has a configuration and a transmission characteristic similar to those of the resonator shown and represented in FIGS. 7 to 23. In other words, resonator RT20 including vias V2, V21 to V23 and planar electrodes P21 to P23 positionally corresponding to vias V1, V11 to V13 and planar electrodes P11 to P13 of a resonator connected to input terminal T1 can also obtain a transmission characteristic the same as or similar to those of resonators RT10 and RT101 to RT103 connected to input terminal T1.

In resonator RT20, as well as resonator RT10, when resonant portion RT23 positionally changes, a frequency at which an attenuation pole on a lower frequency side is generated changes. Thus, by positionally changing resonant portion RT23 in resonator RT20, a passband can be appropriately adjusted so that a passband for a signal in filter device 100 is a desired passband.

Further, by positionally adjusting resonant portion RT13 in resonator RT10 and resonant portion RT23 in resonator RT20, an attenuation pole generated by resonance of resonator RT10 on a lower frequency side and an attenuation pole generated by resonance of resonator RT20 on the lower frequency side can be matched in frequency. Thus, both the attenuation pole generated by resonance of resonator RT10 on the lower frequency side and the attenuation pole generated by resonance of resonator RT20 on the lower frequency side can affect to more attenuate a signal at the attenuation poles on the lower frequency side.

Second Preferred Embodiment

In the first preferred embodiment, resonator RT10 includes one resonant portion RT13 between ground electrode G1 and ground electrode G3, and resonator RT20 includes one resonant portion RT23 between ground electrode G1 and ground electrode G3. However, resonator RT10 and resonator RT20 may each include a plurality of resonant portions between ground electrode G1 and ground electrode G3.

Figure 24:
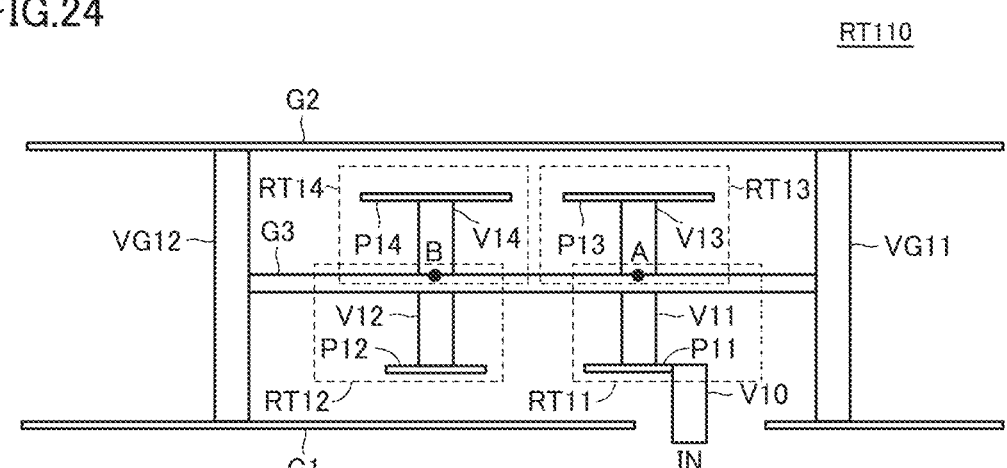
FIG. 24 is a diagram schematically showing a positional relationship of each resonant portion in a resonator according to a second preferred embodiment of the present invention.

FIG. 24 is a diagram schematically showing a positional relationship of each resonant portion in a resonator RT110 according to a second preferred embodiment. Referring to FIG. 24, resonator RT110 of the second preferred embodiment includes resonant portion RT13 and in addition thereto a resonant portion RT14 between ground electrode G2 and ground electrode G3. Specifically, in resonator RT110, resonant portion RT13 is provided at position A symmetrical or substantially symmetrical to resonant portion RT11 with respect to ground electrode G3, and resonant portion RT14 is provided at position B symmetrical or substantially symmetrical to resonant portion RT12 with respect to ground electrode G3. Resonant portion RT13 and resonant portion RT14 are each connected to ground electrode G3.

Figure 25:
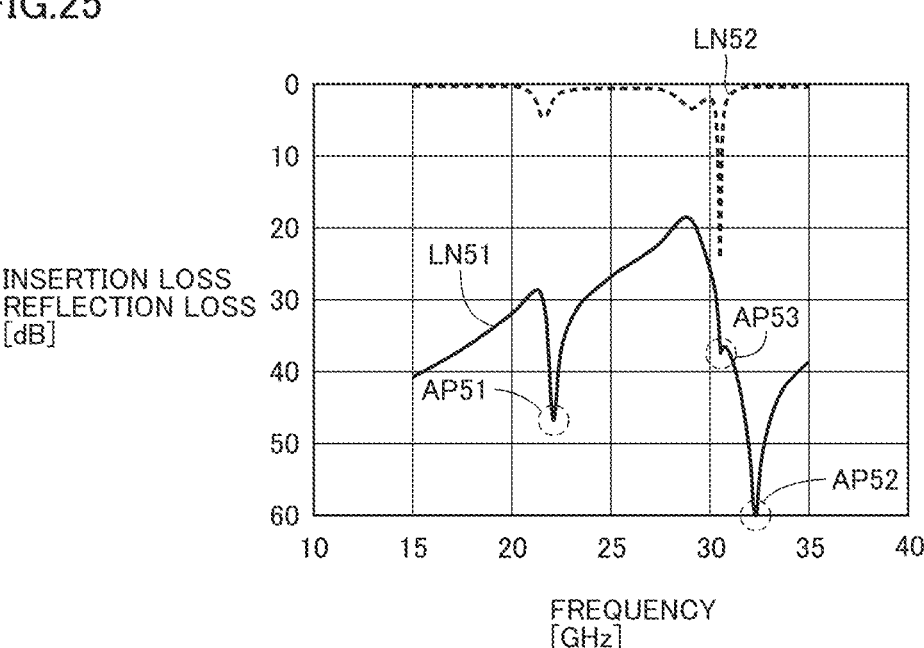
FIG. 25 is a diagram representing a transmission characteristic of the resonator of FIG. 24.

FIG. 25 is a diagram representing a transmission characteristic of resonator RT110 of FIG. 24. In FIG. 25, the horizontal axis represents frequency, and the vertical axis represents insertion loss (a solid line LN51) and reflection loss (a broken line LN52). FIG. 25 represents a transmission characteristic when a signal only passes through resonator RT110, and does not consider transmission characteristics of the other resonators RT20 to RT70.

Referring to FIG. 25, in resonator RT110, one attenuation pole AP51 is generated on a lower frequency side than a passband, and two attenuation poles AP52 and AP53 are generated on a higher frequency side than the passband.

As described with reference to FIGS. 8 to 23, when only one resonator RT13 is provided between ground electrode G1 and ground electrode G3, one attenuation pole is generated on a higher frequency side than a passband, whereas when two resonators RT13 and RT14 are provided between ground electrode G1 and ground electrode G3, two attenuation poles AP52 and AP53 are generated on a higher frequency side than the passband. As described with reference to FIGS. 10 and 11, attenuation pole AP51 is mainly generated by an effect of resonant portion RT11 and resonant portion RT13. As described with reference to FIGS. 12 and 13, attenuation pole AP52 is mainly generated by an effect of resonant portion RT11 and resonant portion RT12. It is believed that the additional attenuation pole AP53 is mainly generated by an effect of resonant portion RT13 and resonant portion RT14.

Thus, the resonator includes a plurality of resonant portions between ground electrode G2 and ground electrode G3, and the number of attenuation poles on a higher frequency side increases. Thus, filter device 100 can have an improved attenuation characteristic in a non-passband.

Although FIGS. 24 and 25 show and represent a configuration of resonator RT110 connected to input terminal T1 and the resonator's transmission characteristic, it can be said that resonator RT20 connected to output terminal T2 has a configuration and a transmission characteristic similar to those of resonator RT110 shown and represented in FIGS. 24 and 25. That is, resonator RT20 may further include one resonant portion in addition to resonant portion RT23 between ground electrode G2 and ground electrode G3, and in that case, resonator RT20 can also obtain a transmission characteristics similar to that of resonator RT110.

Other Exemplary Variations

The presently disclosed filter device is not limited to the above-described preferred embodiments, and various variations and applications are possible. Hereinafter, an exemplary variation applicable to the presently disclosed filter device will be described.

Although filter device 100 according to a preferred embodiment includes, for example, five resonators RT30 to RT70 as intermediate resonators, filter device 100 may include at least one intermediate resonator.

In filter device 100 according to a preferred embodiments includes resonator RT10 connected to input terminal T1 and resonator RT20 connected to output terminal T2 both including a plurality of λ/4 resonators. However, any one of resonator RT10 connected to input terminal T1 and resonator RT20 connected to output terminal T2 may be a resonator including one λ/2 resonator between input terminal T1 or output terminal T2 and ground electrode G2.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:

a dielectric substrate including a plurality of dielectric layers that are stacked;

an input terminal;

an output terminal;

a first ground electrode and a second ground electrode opposed to each other;

a first resonator connected to one of the input terminal and the output terminal; and a second resonator connected to another terminal of the input terminal and the output terminal different from the one of the input terminal and the output terminal; wherein the first resonator includes:

a first intermediate ground electrode between the first ground electrode and the second ground electrode and connected to the first ground electrode and the second ground electrode;

a first resonant portion between the first ground electrode and the first intermediate ground electrode and connected to the first intermediate ground electrode and the one of the input terminal and the output terminal;

a second resonant portion between the first ground electrode and the first intermediate ground electrode and connected to the first intermediate ground electrode; and a third resonant portion between the second ground electrode and the first intermediate ground electrode and connected to the first intermediate ground electrode; and each of the first resonant portion, the second resonant portion, and the third resonant portion includes a first conductor including a via provided inside the dielectric substrate; and the second resonator includes:

a second intermediate ground electrode between the first ground electrode and the second ground electrode and connected to the first ground electrode and the second ground electrode;

a fourth resonant portion between the first ground electrode and the second intermediate ground electrode and connected to the second intermediate ground electrode and the another terminal;

a fifth resonant portion between the first ground electrode and the second intermediate ground electrode and connected to the second intermediate ground electrode; and a sixth resonant portion between the second ground electrode and the second intermediate ground electrode and connected to the second intermediate ground electrode.

2. The filter device according to claim 1, wherein the third resonant portion is provided on a path interconnecting a position symmetrical or substantially symmetrical to the first resonant portion with respect to the first intermediate ground electrode and a position symmetrical or substantially symmetrical to the second resonant portion with respect to the first intermediate ground electrode.

3. The filter device according to claim 1, wherein the third resonant portion is provided at a position symmetrical or substantially symmetrical to the first resonant portion with respect to the first intermediate ground electrode.

4. The filter device according to claim 1, wherein the third resonant portion is provided at a position symmetrical or substantially symmetrical to the second resonant portion with respect to the first intermediate ground electrode.

5. The filter device according to claim 1, wherein the third resonant portion is provided at a position different from a position on a path interconnecting a position symmetrical or substantially symmetrical to the first resonant portion with respect to the first intermediate ground electrode and a position symmetrical or substantially symmetrical to the second resonant portion with respect to the first intermediate ground electrode.

6. The filter device according to claim 1, wherein the first resonant portion and the second resonant portion are coupled by inductive coupling or capacitive coupling.

7. The filter device according to claim 1, wherein the via of each of the first resonant portion, the second resonant portion, and the third resonant portion has a length of about ¼ of a wavelength corresponding to a center frequency of a passband.

8. The filter device according to claim 7, wherein the first resonant portion, the second resonant portion, and the third resonant portion each include the first conductor connected to the first intermediate ground electrode, and a planar electrode connected to the first conductor and opposite to the first ground electrode or the second ground electrode.

9. The filter device according to claim 7, further comprising:

at least one intermediate resonator including a second conductor having a length of about ½ of a wavelength corresponding to the center frequency; wherein the first resonator is inductively coupled to the at least one intermediate resonator.

10. The filter device according to claim 9, wherein the at least one intermediate resonator includes the second conductor, a first planar electrode connected to the second conductor and opposite to the first ground electrode, and a second planar electrode connected to the second conductor and opposite to the second ground electrode.

11. A filter device comprising:

an input terminal;

an output terminal;

a first ground electrode and a second ground electrode opposed to each other;

a first resonator connected to the input terminal;

a second resonator connected to the output terminal; and at least one intermediate resonator coupled to at least one of the first resonator and the second resonator by inductive coupling; wherein the first resonator includes:

a first intermediate ground electrode between the first ground electrode and the second ground electrode and connected to the first ground electrode and the second ground electrode;

a first resonant portion between the first ground electrode and the first intermediate ground electrode and connected to the first intermediate ground electrode and the input terminal;

a second resonant portion between the first ground electrode and the first intermediate ground electrode and connected to the first intermediate ground electrode; and a third resonant portion between the second ground electrode and the first intermediate ground electrode and connected to the first intermediate ground electrode; and the second resonator includes:

a second intermediate ground electrode between the first ground electrode and the second ground electrode and connected to the first ground electrode and the second ground electrode;

a fourth resonant portion between the first ground electrode and the second intermediate ground electrode and connected to the second intermediate ground electrode and the output terminal;

a fifth resonant portion between the first ground electrode and the second intermediate ground electrode and connected to the second intermediate ground electrode; and a sixth resonant portion between the second ground electrode and the second intermediate ground electrode and connected to the second intermediate ground electrode.

12. A radio frequency front end circuit comprising the filter device according to claim 1.

13. The radio frequency front end circuit according to claim 12, wherein the third resonant portion is provided on a path interconnecting a position symmetrical or substantially symmetrical to the first resonant portion with respect to the first intermediate ground electrode and a position symmetrical or substantially symmetrical to the second resonant portion with respect to the first intermediate ground electrode.

14. The radio frequency front end circuit according to claim 12, wherein the third resonant portion is provided at a position symmetrical or substantially symmetrical to the first resonant portion with respect to the first intermediate ground electrode.

15. The radio frequency front end circuit according to claim 12, wherein the third resonant portion is provided at a position symmetrical or substantially symmetrical to the second resonant portion with respect to the first intermediate ground electrode.

16. The radio frequency front end circuit according to claim 12, wherein the third resonant portion is provided at a position different from a position on a path interconnecting a position symmetrical or substantially symmetrical to the first resonant portion with respect to the first intermediate ground electrode and a position symmetrical or substantially symmetrical to the second resonant portion with respect to the first intermediate ground electrode.

17. The radio frequency front end circuit according to claim 12, wherein the first resonant portion and the second resonant portion are coupled by inductive coupling or capacitive coupling.

18. A radio frequency front end circuit comprising the filter device according to claim 11.

\* \* \* \* \*